(12) United States Patent
Takiguchi et al.

(10) Patent No.: US 9,947,556 B2
(45) Date of Patent: Apr. 17, 2018

(54) SUBSTRATE CLEANING APPARATUS, SUBSTRATE CLEANING METHOD, AND STORAGE MEDIUM

(71) Applicant: TOKYO ELECTRON LIMITED, Tokyo (JP)

(72) Inventors: Yasushi Takiguchi, Koshi (JP); Taro Yamamoto, Koshi (JP); Hideharu Kyouda, Koshi (JP); Koshi Muta, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 626 days.

(21) Appl. No.: 14/321,054

(22) Filed: Jul. 1, 2014

(65) Prior Publication Data

US 2015/0027492 A1    Jan. 29, 2015

(30) Foreign Application Priority Data

Jul. 23, 2013  (JP) .................................. 2013-152842

(51) Int. Cl.
| | | |
|---|---|---|
| *B08B 1/04* | (2006.01) | |
| *B08B 3/04* | (2006.01) | |
| *H01L 21/67* | (2006.01) | |
| *H01L 21/687* | (2006.01) | |

(52) U.S. Cl.
CPC .. *H01L 21/67051* (2013.01); *H01L 21/67046* (2013.01); *H01L 21/68792* (2013.01)

(58) Field of Classification Search
CPC ......... H01L 21/67046; H01L 21/67051; H01L 21/68792
See application file for complete search history.

(56) References Cited

U.S. PATENT DOCUMENTS

| | | | |
|---|---|---|---|
| 6,286,525 B1* | 9/2001 | Nishimura | ................ B08B 1/04 134/153 |
| 2002/0092544 A1 | 7/2002 | Namba | |
| 2008/0163899 A1 | 7/2008 | Takiguchi et al. | |
| 2010/0130105 A1 | 5/2010 | Lee | |
| 2012/0014689 A1* | 1/2012 | Ookouchi | ......... H01L 21/02087 396/611 |

(Continued)

FOREIGN PATENT DOCUMENTS

| | | |
|---|---|---|
| JP | 10-308370 A1 | 11/1998 |
| JP | 2002-066467 A1 | 3/2002 |

(Continued)

*Primary Examiner* — Douglas Lee
(74) *Attorney, Agent, or Firm* — Burr & Brown, PLLC

(57) ABSTRACT

There are provided first and second cleaning members which are configured to clean a central zone in a rear surface of a wafer when the wafer held by an absorption pad is horizontally held, and configured to clean a peripheral zone in the rear surface of the wafer when the wafer is held by the spin chuck. Due to the provision of the first and second cleaning members, detergency can be improved as compared with a case in which only one cleaning member is used. The first and second cleaning members are configured to be horizontally turned by a common turning shaft. When the central zone in the rear surface of the wafer is cleaned, the turning shaft is located to be overlapped with the wafer. Since the turning shaft is located by using the moving area of the wafer, a size of an apparatus can be reduced.

12 Claims, 16 Drawing Sheets

(56) References Cited

U.S. PATENT DOCUMENTS

2014/0102474 A1   4/2014   Takiguchi et al.

FOREIGN PATENT DOCUMENTS

| JP | 2004-119782 A1 | 4/2004 |
| JP | 2008-177541 A1 | 7/2008 |
| TW | 201025495 A1 | 7/2010 |
| TW | 201308492 A | 2/2013 |
| TW | 1390590 B1 | 3/2013 |

* cited by examiner (a)

(b)

(a)

(b)

(a)

(b)

SUBSTRATE CLEANING APPARATUS, SUBSTRATE CLEANING METHOD, AND STORAGE MEDIUM

CROSS REFERENCE TO RELATED APPLICATIONS

This application is based upon and claims the benefit of priority from the prior Japanese Patent Application No. 2013-152842 filed on Jul. 23, 2013, the entire contents of which are incorporated herein by reference.

FIELD OF THE INVENTION

The present invention relates to a technique for cleaning a rear surface of a substrate, such as a semiconductor wafer and a glass substrate (LCD substrate) for a liquid crystal display panel.

BACKGROUND ART

In order to maintain clean a semiconductor wafer (hereinafter referred to as "wafer"), for example, manufacturing steps for a semiconductor device include a step for cleaning the wafer according to need, in each manufacturing step and before or after a certain step.

In accordance with a finer circuit pattern, it is necessary to clean a rear surface of the wafer, for coping with a defocus. The defocus is a phenomenon in which a pattern becomes out of focus upon exposure because of a warp of a wafer. The defocus may occur, for example, when the wafer is exposed in such a manner that particles adhering on a rear surface of the wafer remain between a stage on which the wafer is placed and the wafer.

As to a cleaning method of the rear surface of the wafer, Patent Document 1 proposes a technique in which a rear surface of a substrate is supported and held, and the rear surface of the substrate is cleaned by a brush. In this method, the substrate is transferred between a first substrate holding unit for holding a peripheral zone in the rear surface of the substrate, and a second substrate holding unit for holding a central zone in the rear surface of the substrate. Thus, the whole rear surface of the substrate can be cleaned. In addition, the method requires no space for reversing the substrate, a size of an apparatus can be reduced.

However, as a wiring has recently become finer due to a technique such as a liquid immersion exposure and a double patterning, the number of steps included in the manufacturing steps of a semiconductor device increases. Thus, particles are more likely to adhere on a rear surface of a wafer, whereby improvement in detergency is further required. In addition, further enlargement of a wafer size, i.e., a diameter from 300 mm to 450 mm is under review, but an apparatus that is small in size as much as possible is preferred. In order thereto, it is under review that a plurality of brushes are used in one cleaning apparatus to improve detergency, while a size of the apparatus is reduced.

Patent Document 2 proposes a structure in which, when an upper surface of a substrate is cleaned by two cleaning brushes attached to one support arm while the substrate is rotated about a vertical axis, a distal end block of the support arm is formed into an arcuate shape and is rotated about the vertical axis. Since this method is for cleaning an upper surface of a substrate, it is necessary to move the cleaning brush through a rotational center of the substrate to reach an outer peripheral part thereof, in order to clean a central zone of the substrate. Since a driving mechanism of the support arm is located outside a cup surrounding a circumference of the substrate, a turning radius of the support arm supporting the cleaning brush is larger than a radius of the substrate. Thus, it is difficult to reduce a size of the apparatus. Moreover, since the cleaning brush moves through the rotational center of the substrate up to the outer peripheral part thereof, a moving distance of the cleaning brush is long, which elongates a process time.

Patent Document 3 proposes a technique for cleaning a substrate surface with the use of two cleaning tools of different functions. Since the cleaning tools are disposed on separate arms and the arms are located outside a wafer, it is difficult to make smaller an apparatus. In addition, during a cleaning operation, the respective arms are moved from one end side of the wafer up to the other end side thereof, a moving distance (moving time) of each arm is long, so that it takes a longer time to process the wafer. As described above, Patent Document 2 and Patent Document 3 are not for cleaning a rear surface of a substrate. Even when these techniques are employed, it is difficult to reduce a size of an apparatus. Thus, neither Patent Document 2 nor 3 can solve the problem of the present invention.

Patent Documents

Patent Document 1: JP2008-177541A
Patent Document 2: JP10-308370A (FIGS. 8 and 12, Paragraphs 0044 and 0058, etc.)
Patent Document 3: JP2002-66467A

SUMMARY OF THE INVENTION

Problem to be Solved by Invention

The present invention has been made under these circumstances. The object of the present invention is to provide a technique for reducing a size of a substrate cleaning apparatus for cleaning a rear surface of a substrate, and improving detergency of the substrate cleaning process.

Means for Solving Problem

In order to achieve this object, a substrate cleaning apparatus of the present invention is a substrate cleaning apparatus configured to clean a rear surface of a circular substrate, comprising: a first absorbing and holding unit configured to be horizontally movable while horizontally absorbing and holding a zone that does not overlap with a central portion in the rear surface of the substrate; a second absorbing and holding unit configured to be rotated about a vertical axis while horizontally absorbing and holding the central portion in the rear surface of the substrate; a first cleaning member and a second cleaning member that are laterally spaced apart from each other, the first cleaning member and the second cleaning member being configured to be in contact with the zone including the central portion in the rear surface of the substrate so as to clean the same, when the substrate is held by the first absorbing and holding unit, and being configured to be in contact with a zone other than the central portion in the rear surface of the substrate so as to clean the same, when the substrate is held by the second absorbing and holding unit; a turning mechanism configured to horizontally turn the first cleaning member and the second cleaning member by a common turning shaft, when the rear surface of the substrate is cleaned; an elevation mechanism configured to move upward or downward the first cleaning member and the second cleaning member; and a cleaning-liquid supply unit configured to supply a cleaning liquid onto the rear surface of the substrate, when the rear surface of the substrate is cleaned by the first cleaning member and the second cleaning member; wherein the turning shaft is located to be overlapped with the substrate, at least when the zone including the central portion in the rear surface of the substrate is cleaned.

In addition, a substrate cleaning method of the present invention is a substrate cleaning method for cleaning a rear surface of a circular substrate, comprising: using a turning mechanism configured to horizontally turn a first cleaning member and a second cleaning member, respectively, by a common turning shaft; horizontally absorbing and holding a zone that does not overlap with a central portion in the rear surface of the substrate by the first absorbing and holding unit, and turning the first cleaning member and the second cleaning member in contact with the zone including the central portion in the rear surface of the substrate so as to clean the zone, while supplying a cleaning liquid to the rear surface of the substrate; and horizontally absorbing and holding the central portion in the rear surface of the substrate by the second absorbing and holding unit, and, with the second absorbing and holding unit being rotated around a vertical axis, turning the first cleaning member and the second cleaning member in contact with a zone other than the central portion in the rear surface of the substrate so as to clean the zone, while supplying a cleaning liquid to the rear surface of the substrate; wherein the turning shaft is located to be overlapped with the substrate, at least when the zone including the central portion in the rear surface of the substrate is cleaned.

Further, a storage medium of the present invention is a storage medium storing a program for use in a substrate cleaning apparatus for cleaning a rear surface of a circular substrate, wherein the program has steps for performing the above-described substrate cleaning method.

Effect of Invention

According to the substrate cleaning apparatus of the present invention, since the first cleaning member and the second cleaning member are provided, the detergency can be improved as compared with a case in which only one cleaning member is used. In addition, the first cleaning member and the second cleaning member are configured to be respectively turned horizontally by the common turning shaft. The zone including the central portion in the rear is cleaned in such a manner that the substrate, which is absorbed and held by the first substrate holding unit, is horizontally moved. When the zone including the central portion is cleaned, the turning shaft is located to be overlapped with the substrate. In this manner, since the turning shaft is installed by using a moving area of the substrate, the apparatus can be reduced in size.

BEST MODE FOR CARRYING OUT THE INVENTION

In an embodiment described herebelow, as one of the examples of a substrate cleaning apparatus (hereinafter referred to as "cleaning apparatus"), a cleaning apparatus of a type that is installed on a coating/developing apparatus is explained. A concrete example of a photolithographic process including a cleaning step performed by the cleaning apparatus will be described after. The cleaning apparatus of the present invention is located in the vicinity of an exit of a coating/developing apparatus, for example, and has a function for cleaning a rear surface of a wafer on which a resist film has been formed, and for transferring the wafer toward a succeeding exposure apparatus.

Figure 1:
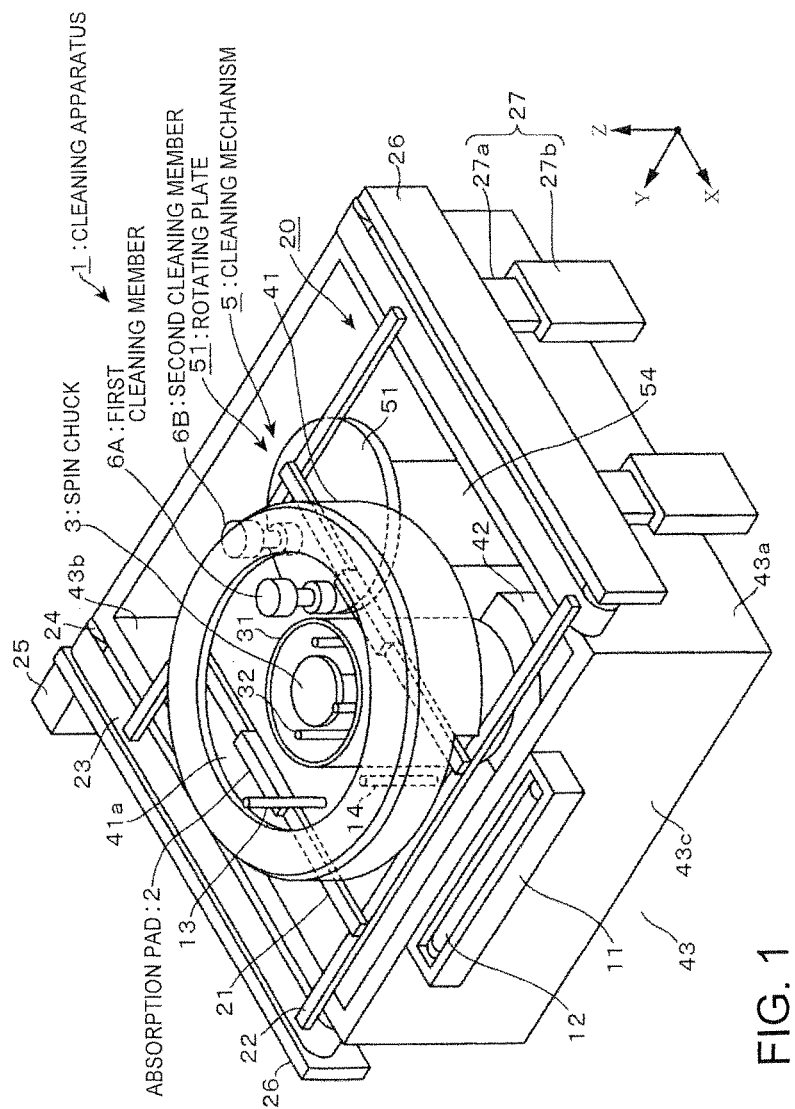
FIG. 1 is a perspective view showing a cleaning apparatus according to the present invention.

A structure of the cleaning apparatus according to this embodiment is firstly described with reference to FIGS. 1 to 4. FIG. 1 is a perspective view showing the cleaning apparatus 1, FIGS. 2 and 4 are longitudinal sectional views thereof, and FIG. 3 is a plan view thereof.

Figure 2:
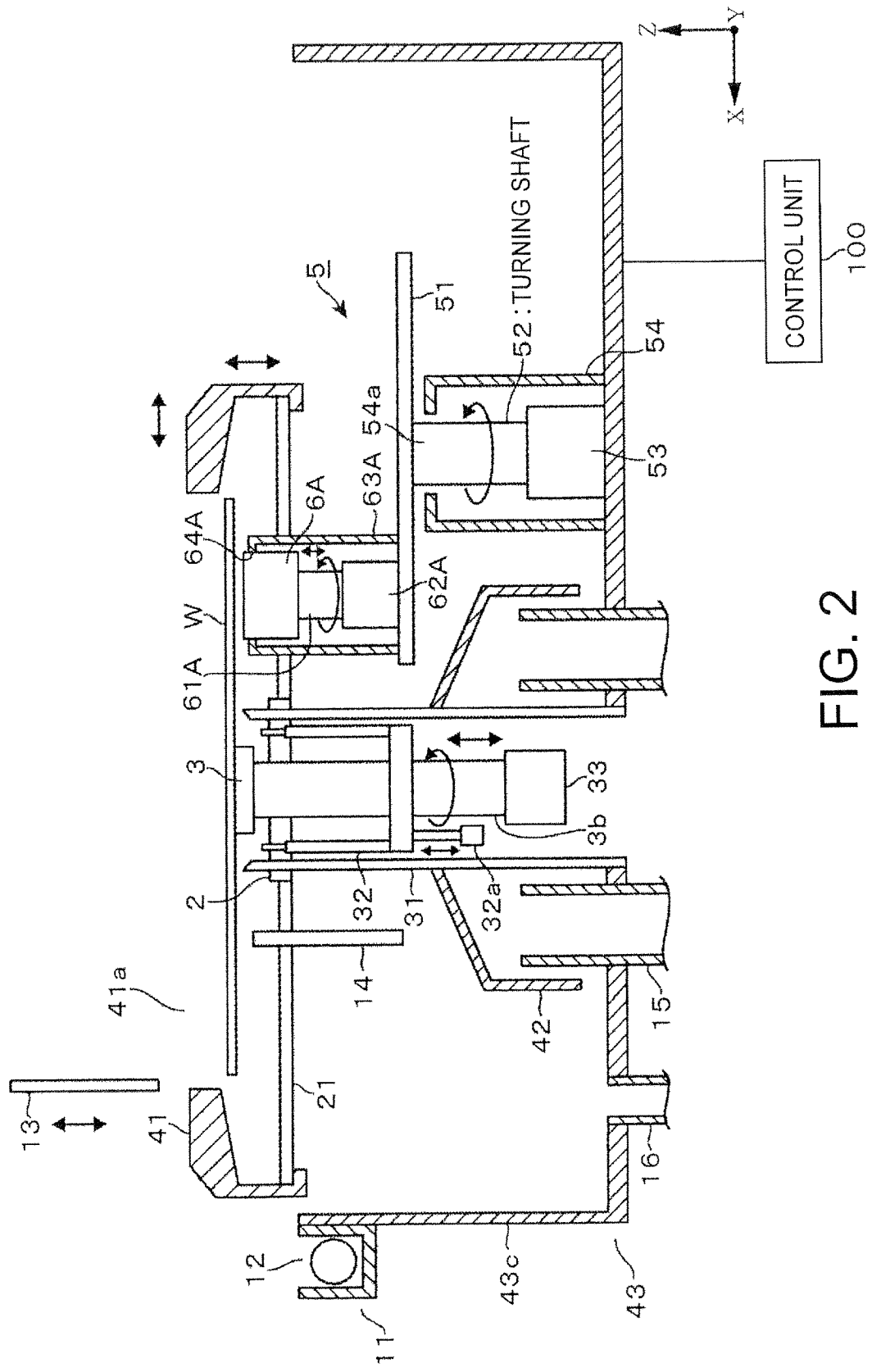
FIG. 2 is a longitudinal sectional view showing the cleaning apparatus.
Figure 3:
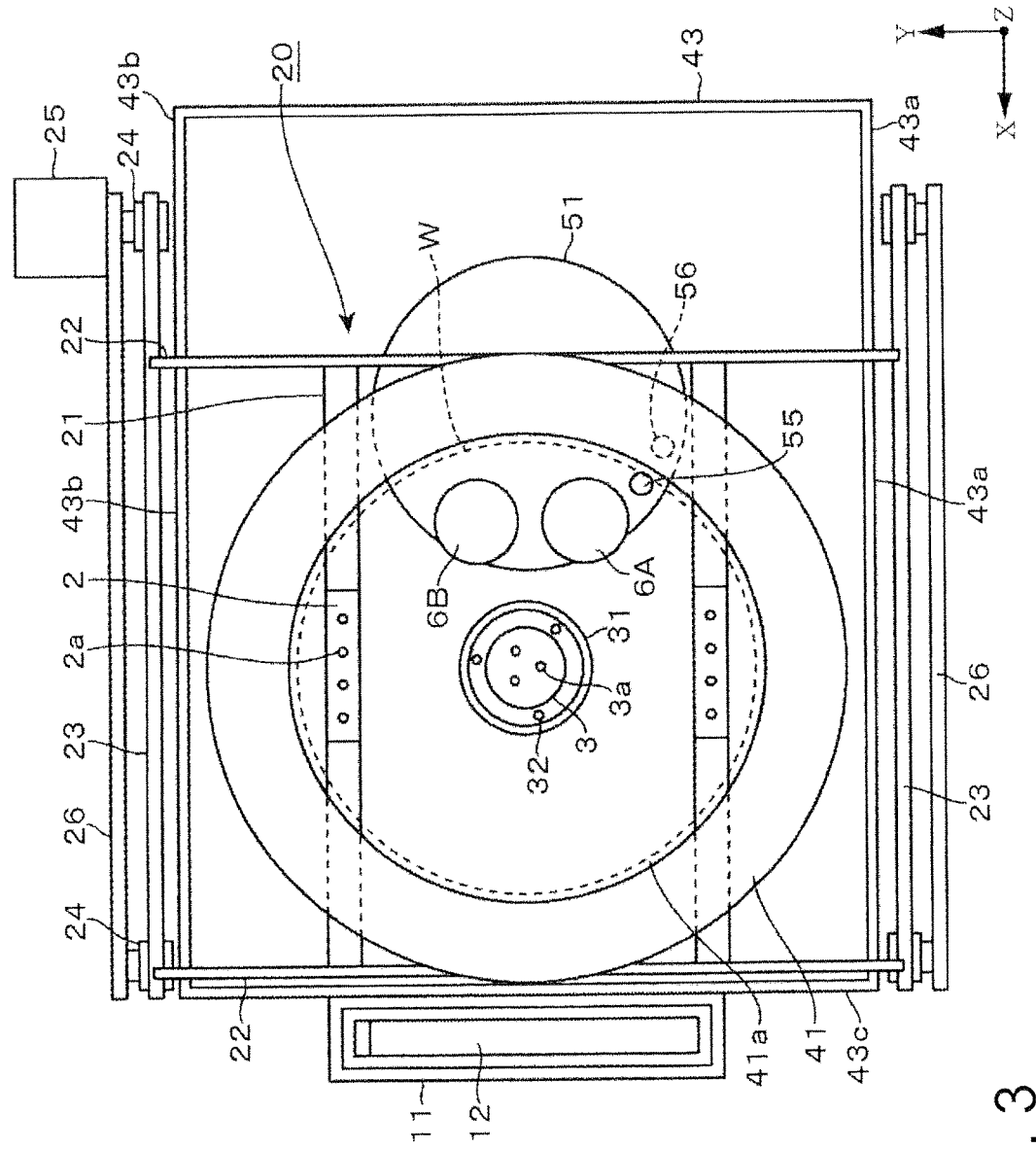
FIG. 3 is a plan view showing the cleaning apparatus.
Figure 4:
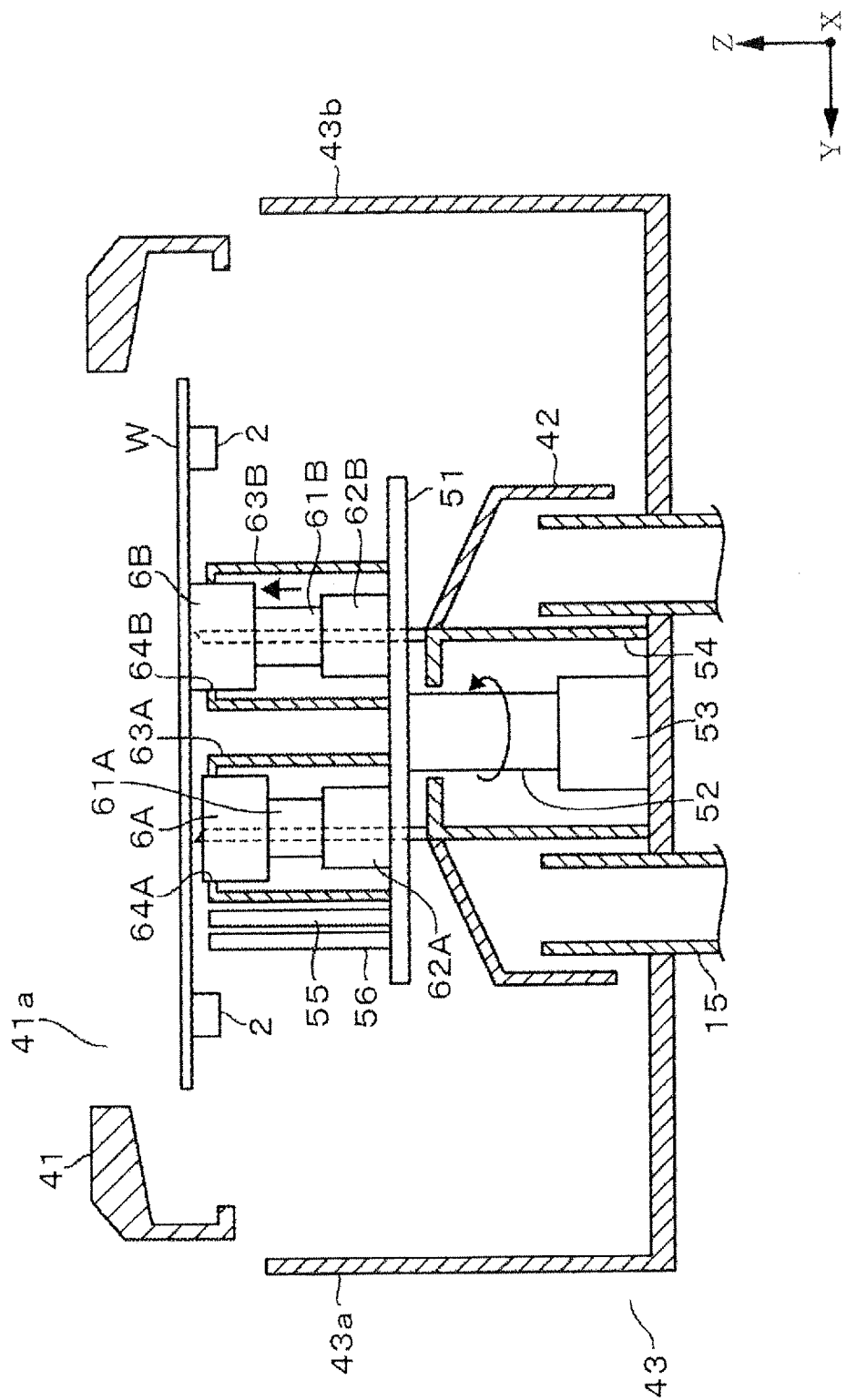
FIG. 4 is a longitudinal sectional view showing the cleaning apparatus.

As shown in FIGS. 1 to 3, the cleaning apparatus 1 includes an absorption pad 2 configured to substantially horizontally absorb and hold a wafer W, a spin chuck 3 configured to receive the wafer W from the absorption pad 2 and to substantially horizontally absorb and hold the wafer W, and a cleaning mechanism 5 configured to clean a rear surface of the wafer W. The absorption pad 2 serves as a first substrate holding unit, and the spin chuck 3 serves as a second substrate holding unit, respectively. The absorption pad 2, the spin chuck 3 and the cleaning mechanism 5 are disposed in a box-shaped under cup 43 having an open upper surface. The under cup 43 has a rectangular shape in plan view, for example, with opposed sidewalk. A direction where the two opposed front and rear sidewalls 43a and 43b in FIG. 1 extend is referred to as "X direction".

First, the absorption pad 2 is explained initially. The absorption pad 2 is configured to be horizontally movable, while horizontally absorbing and holding a zone in a rear surface of a wafer W, which does not overlap with a central portion in the rear surface of the wafer W. The cleaning apparatus 1 has the two absorption pads 2. Each of the absorption pads 2 is formed of an elongated block, for example. The two absorption pads 2 are arranged so as to be capable of supporting and holding parts (first zone) near to a peripheral portion in the rear surface of the wafer W, such that the parts are in substantially parallel with each other. Each absorption pad 2 is connected to a suction pipe, not shown, and has a function as a vacuum chuck for absorbing and holding the wafer W through an absorption hole 2a shown in FIG. 3. Each of the absorption pads 2 is attached to substantially a central portion of a pad supporting unit 21 of an elongated rod-like shape. Both ends of the two pad supporting units 21 are respectively attached to two bridge beams 22, whereby a lattice part 20 composed of the pad supporting units 21 and the bridge beams 22 is formed.

Both ends of the two bridge beams 22 are respectively fixed on two belts 23 that are disposed outside the opposed two sidewalls 43a and 43b of the under cup 43 along the sidewalls 43a and 43b. Each belt 23 is wound around a pair of winding shafts 24, and the respective winding shafts 24 are attached to two side plates 26 located in parallel with the aforementioned two opposed sidewalls 43a and 43b. One of the winding shafts 24 is connected to a driving mechanism 25. Thus, the bridge beams 22 can be moved through the winding shafts 24 and the belts 23, whereby the above-described lattice part 20 can be moved as a whole in the X direction shown in FIGS. 1 to 3.

In addition, as shown in FIG. 1, each of the side plates 26 is fixed on a floor surface of a housing, not shown, of the cleaning apparatus 1, with a bottom surface of the side plate 26 being supported by a pair of elevating mechanisms 27 each including a slider 27a and a guide rail 27b. One of the elevating mechanisms 27 is equipped with a not-shown driving mechanism. Thus, by moving upward or downward the slider 27a in the guide rail 27b, the aforementioned lattice part 20 can be moved as a whole upward or downward in a Z direction in FIG. 1.

Further, a doughnut-like upper cup 41 for preventing scattering of a cleaning liquid is disposed above the lattice part 20. An opening 41a having a larger diameter than that of a wafer W is formed in an upper surface of the upper cup 41. A wafer W can be transferred, through the opening 41a, between a transport mechanism of the below-described coating/developing apparatus and the absorption pads 2 or the spin chuck 3. The upper cup 41 disposed above the lattice part 20 is configured to be moved in conjunction with the movement of the lattice part 20 in the X direction and in the Z direction.

Next, the spin chuck 3 is explained. The spin chuck 3 is configured to be rotatably about a vertical axis, while horizontally absorbing and holding a central portion (second zone) in the rear surface of the wafer W. The spin chuck 3 has a discoid shape, and is located on an intermediate position between the two absorption pads 2 that are arranged substantially in parallel with each other. The first zone and the second zone in the rear surface of the wafer W, which are supported by the respective substrate holding units (absorption pad 2, spin chuck 3), do not overlap with each other. As shown in FIG. 2, the spin chuck 3 is connected to a driving mechanism (spin chuck motor) 33 through a rotation and elevation shaft 3b, so that the spin chuck 3 is configured to be rotatable and elevatable (movable upward or downward) by the driving mechanism 33. In addition, similarly to the absorption pad 2, since the spin chuck 3 is connected to a suction pipe, not shown, the spin chuck 3 has a function as a vacuum chuck for absorbing and holding a wafer W through an absorption hole 3a shown in FIG. 3.

A support pin 32 connected to an elevation mechanism 32a is disposed on a lateral side of the spin chuck 3, such that the support pin 32 can be moved upward or downward while supporting the rear surface of the wafer W. By means of a cooperation with an outside transport mechanism, the wafer W can be transferred from the transport mechanism to the absorption pads 2, and from the spin chuck 3 to the transport mechanism.

Figure 5:
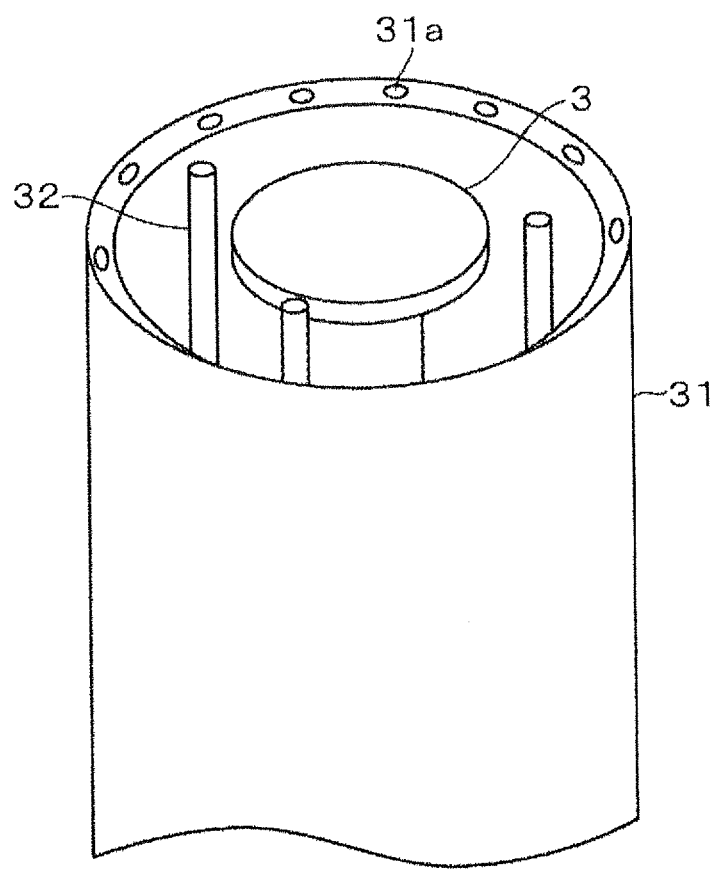
FIG. 5 is a perspective view showing an air knife disposed on the cleaning apparatus.

Further, as shown in FIGS. 3 and 5, an air knife 31 is disposed around the spin chuck 3 and the support in 32 so as to surround these equipment. The air knife 31 is formed of a cylindrical surrounding member. Gas jet orifices 31a are formed in an upper end of the air knife 31 along a circumferential direction thereof. The jet orifices 31a are configured to jet a gas, such as a compressed air, toward the rear surface of the wafer W. For example, the air knife 31 is formed of a double cylinder, and is configured to supply a gas, which is supplied from a not-shown supply unit, to the jet orifices 31a through a hollow space in the double cylinder. The air knife 31 has a function for drying the rear surface of the wafer W by blowing a cleaning liquid thereon to the outside of the cylinder so as to dry the rear surface of the wafer W, when the wafer W is transferred to the spin chuck 3, in order that a front surface of the spin chuck 3 and the rear surface (second zone) of the substrate supported by the spin chuck 3 come into contact with each other in a dried state.

A height position of the wafer W is explained. As described below, the wafer W is transferred from the outside transport mechanism to the absorption pads 2. Then, the central portion (second zone) in the rear surface of the wafer W is cleaned, by moving the wafer W held by the absorption pads 2 rightward in the X direction shown in FIG. 2. FIGS. 2 and 4 show that the wafer W located at a height position that is a cleaning position. At this cleaning position, the rear surface of the wafer W is located above a distal end of the air knife 31. Thus, when the wafer W held by the absorption pads 2 is moved in the X direction, the rear surface of the wafer W does not interfere with the air knife 31.

Next, a cleaning mechanism 5 for cleaning the rear surface of the wafer W is explained. The cleaning mechanism 5 includes a rotating plate 51 as a planar body, and a plurality of cleaning members 6 disposed above the rotating plate 51. The rotating plate 51 is formed of, for example, a circular plate, and is located to face the wafer W held by the absorption pads 2 or the spin chuck 3. The rotating plate 51 is configured to be rotatable about the vertical axis by a driving mechanism 53 through a turning shaft 52 disposed on a rear surface side of the rotating plate 51. The turning shaft 52 is disposed on a center of the rotating plate 51. Thus, in plan view, the center of the rotating plate 51 and the center of the turning shaft 52 align with each other, and this aligned centers provide a turning center O1. In this example, the rotating plate 51, the turning shaft 52 and the driving mechanism 53 constitute a turning mechanism.

Figure 6:
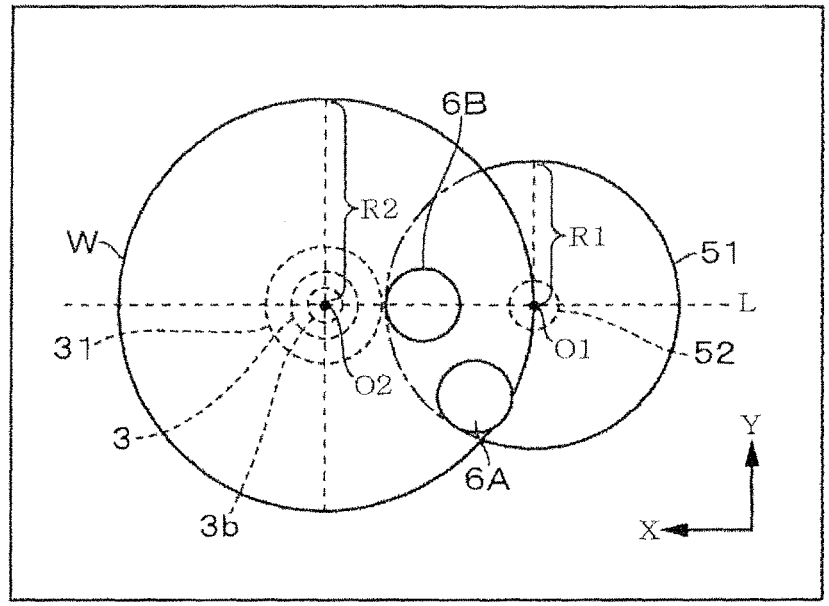
FIG. 6 is a plan view showing a wafer, a first cleaning member, a second cleaning member and a rotating plate.
Figure 6:
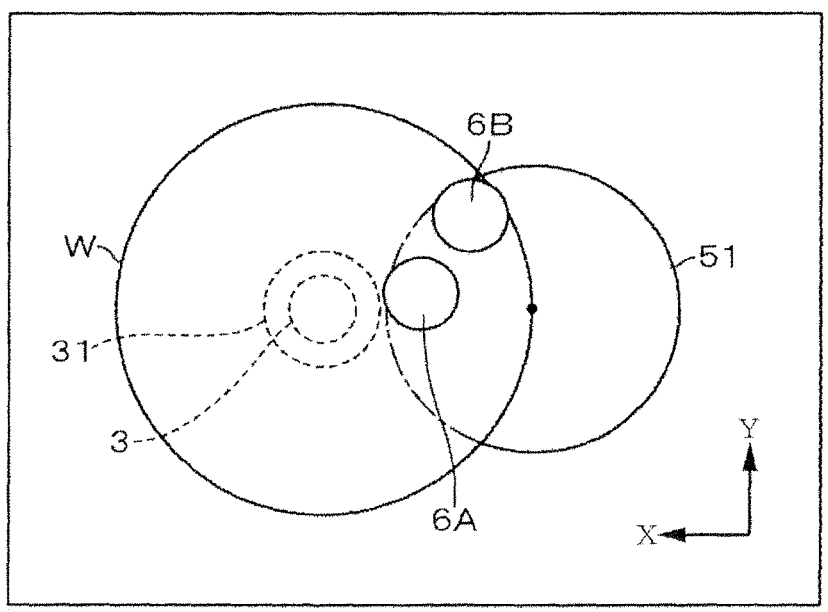

FIG. 6 shows the wafer W held by the spin chuck 3 and the rotating plate 51. The rotating plate 51 has a radius R1 which is smaller than a radius R2 of the wafer W. In addition, as described below, when a zone including a central portion in the rear surface of the wafer W is cleaned, the wafer W, which is held by the absorption pads 2, is moved rightward in the X direction. The turning shaft 52 is located within the moving area of the wafer W. Namely, when the zone including the central portion is cleaned, the turning shaft 52 is located to be overlapped with the wafer W. Further, in plan view, the turning shaft 52 of the rotating plate 51 and the rotation and elevation shaft 3b of the spin chuck 3 are aligned with each other along the X direction. Furthermore, a cover body 54 is disposed below the rotating plate 51 so as to surround a circumference of the driving mechanism 53. The cover body 54 is formed of, for example, a cylindrical body. An opening 54a is formed in an upper surface of the cover body 54 to allow the movement of the turning shaft 52.

The cleaning mechanism 5 in this example includes the plurality of, e.g., two cleaning members 6 (6A, 6B) of different types. One of the cleaning members 6, i.e., a first cleaning member 6A is used for cleaning, and the other of the cleaning members 6, i.e., a second cleaning member 6B is used for polishing. Herein, a polishing process of the rear surface of the wafer W is regarded as one of the cleaning processes. The first and second cleaning members 6A and 6B are formed of, for example, columnar brushes, and are connected to driving mechanisms 62A and 62B through driving shafts 61A and 61B. The driving mechanisms 62A and 62B are configured to elevate (move upward or downward) the cleaning members 6A and 6B and to rotate the same about the vertical axis. The driving mechanisms 62A and 62B are mounted above the rotating plate 51. Side surfaces of the driving mechanisms 62A and 62B and side surfaces of the cleaning mechanism brushes 6A and 6B are covered with, for example, cylindrical brush covers 63A and 63B. Openings 64A and 64B are formed in upper surfaces of the brush covers 63A and 63B to allow the movement of the cleaning members 6A and 6B. In FIG. 1, illustration of the brush covers 63A and 63B is omitted.

FIG. 2 shows that the wafer W is held by the spin chuck 3 at the cleaning position, and that the first cleaning member 6A is located at a waiting position. On the other hand, FIG. 4 shows that the wafer W is supported by the absorption pads 2 at the cleaning position, that the first cleaning member 6A is located at the waiting position, and that the second cleaning member 6B is located at the cleaning position. When the cleaning members 6A and 6B are located at the waiting positions, upper surfaces of the cleaning members 6A and 6B are located below the wafer W that is located at the cleaning position. When the wafer W is polished or cleaned, the cleaning member 6A or 6B is moved upward so that the upper surface of the cleaning member 6A or 6B is urged against the rear surface of the wafer.

The cleaning members 6A and 6B are made of, for example, a PVC sponge, a urethane sponge, nylon fibers, etc. Suitable materials are respectively selected for the first cleaning member 6A for polishing and the second cleaning member 6B for cleaning, so as to construct brushes. As shown in FIG. 6, the first cleaning member 6A and the second cleaning member 6B are spaced apart from each other in a lateral direction on the rotating plate 51. The first and second cleaning members 6A and 6B are arranged such that, when the wafer W held by the spin chuck 3 is rotated, the first and second cleaning members 6A and 6B are turned in one direction, so that the whole zone excluding the central portion in the rear surface of the wafer W can be cleaned by both of the first and second cleaning members 6A and 6B. To be turned in one direction means that, when the rotation and elevation shaft 3b of the spin chuck 3 is seen from the turning shaft 52 of the rotating plate 51, the first cleaning member 6A, which is located on one of the left side and the right side, in this example, on the left side, is turned to move toward the other side, in this example, toward the right side.

In this example, in plan view, when the first cleaning member 6A is located at the center relative to the wafer W held by the spin chuck 3, the second cleaning member 6B is located at the periphery. On the other hand, when the second cleaning member 6B is located at the center relative to the wafer W held by the spin chuck 3, the first cleaning member 6A is located at the periphery. To be located at the periphery means that the cleaning member 6A or 6B is located at a position so as to clean (polish) the outer periphery of the wafer W held by the spin chuck 3. Meanwhile, to be located at the center means that the cleaning member 6A or 6B is located at a position so as to clean (polish) a zone along a line L connecting a rotation center O2 of the spin chuck and the turning center O1. FIG. 6(a) shows that the first cleaning member 6A is located at the periphery, and that the second second cleaning member 6B is located at the center, while FIG. 6(b) shows that the first cleaning member 6A is located at the center, and that the second cleaning member 6B is located at the periphery.

When the first cleaning member 6A located on the left side starts to be turned to move toward the right side, the second cleaning member 6B is located on the line L connecting the turning shaft 52 of the rotating plate 51 and the rotation and elevation shaft 3b of the spin chuck 3. When the turning movement is finished, the first cleaning member 6A is located on the line L. Further, since the radius R1 of the rotating plate 51 is shorter than the radius R2 of the wafer W, turning radii of the first and second cleaning members 6A and 6B are shorter than the radius R2 of the wafer W. The turning radius means a length of the line connecting the center of the cleaning member 6A or 6B and the turning center O1 of the rotating plate 51.

As shown in FIGS. 3 and 4, the rotating plate 51 is equipped with a cleaning liquid nozzle 55 and a blow nozzle 56. Supplied from the cleaning liquid nozzle 55 is a cleaning liquid (e.g., DIW) for flushing particles removed from the rear surface of the wafer W by the second cleaning member 6B. Meanwhile, supplied from the blow nozzle 56 is a gas such as nitrogen ($N_2$) for promoting drying of the cleaning liquid adhering to the rear surface of the cleaned wafer W.

In addition, as shown in FIGS. 2 and 4, in a bottom part of the under cup 43, there are provided a drain pipe 16 for discharging a cleaning liquid stored in the under cup 43, and two exhaust pipes for discharging an airflow in the cleaning apparatus 1. In order to prevent the cleaning liquid stored in the bottom part of the under cup 43 from flowing into the exhaust pipes 15, the exhaust pipes 15 extend upward from the bottom surface of the under cup 43. In addition, in order to prevent that the cleaning liquid dropping down from above from directly entering the exhaust pipes 15, the exhaust pipes 15 are covered with an inner cup 42 serving as a ring-like cover disposed around the air knife 31. The reference number 13 depicts a blow nozzle that blows, after the cleaning of the wafer W has been finished, a compressed air or the like from above toward a part in the vicinity of the outer circumference of the wafer W so as to assist drying of the cleaning liquid remaining thereon. The reference number 14 depicts a cleaning liquid nozzle for supplying the cleaning liquid to the rear surface of the wafer W, together with the cleaning liquid nozzle 55 disposed on the cleaning mechanism 5. The blow nozzle 13 has an elevation mechanism, not shown. Thus, when the wafer W is loaded or unloaded, the blow nozzle 13 is retracted upward so as not to interfere with the transported wafer W and the transport mechanism.

A lamp box 11 accommodating a UV lamp 12 is attached to the sidewall 43c of the under cup 43, which is not equipped with the respective belts 23. The wafer W to be processed is loaded into the cleaning apparatus 1 and unloaded therefrom, from the left side in the X direction. At this time, the wafer is adapted to pass above the UV lamp 12. The UV lamp 12 has a function for irradiating ultraviolet light to the rear surface of the wafer W that has been already cleaned and unloaded, so as to contract particles remaining on the rear surface of the wafer W.

The respective driving mechanisms 25 and 53, the UV lamp 12, a not-shown pressure regulating unit disposed on the exhaust pipe 15 and so on are controlled by a control unit 100 that controls an operation of the coating/developing apparatus as a whole. The control unit 100 is formed of a computer having, for example, a program storage unit, not shown. The program storage unit stores a computer program including a step (instruction) group regarding an operation for transferring a wafer W, which has been received from the outside transport apparatus, between the absorption pads 2 and the spin chuck 3, an operation for cleaning the wafer W by the cleaning mechanism 5, and so on. The control unit 100 reads out the computer program, and the control unit 100 controls an operation of the cleaning apparatus 1. The computer program, which is stored in a memory mechanism, such as a hard disc, a compact disc, a magnet optical disc and a memory card, is stored in the program storage unit.

Figure 7:
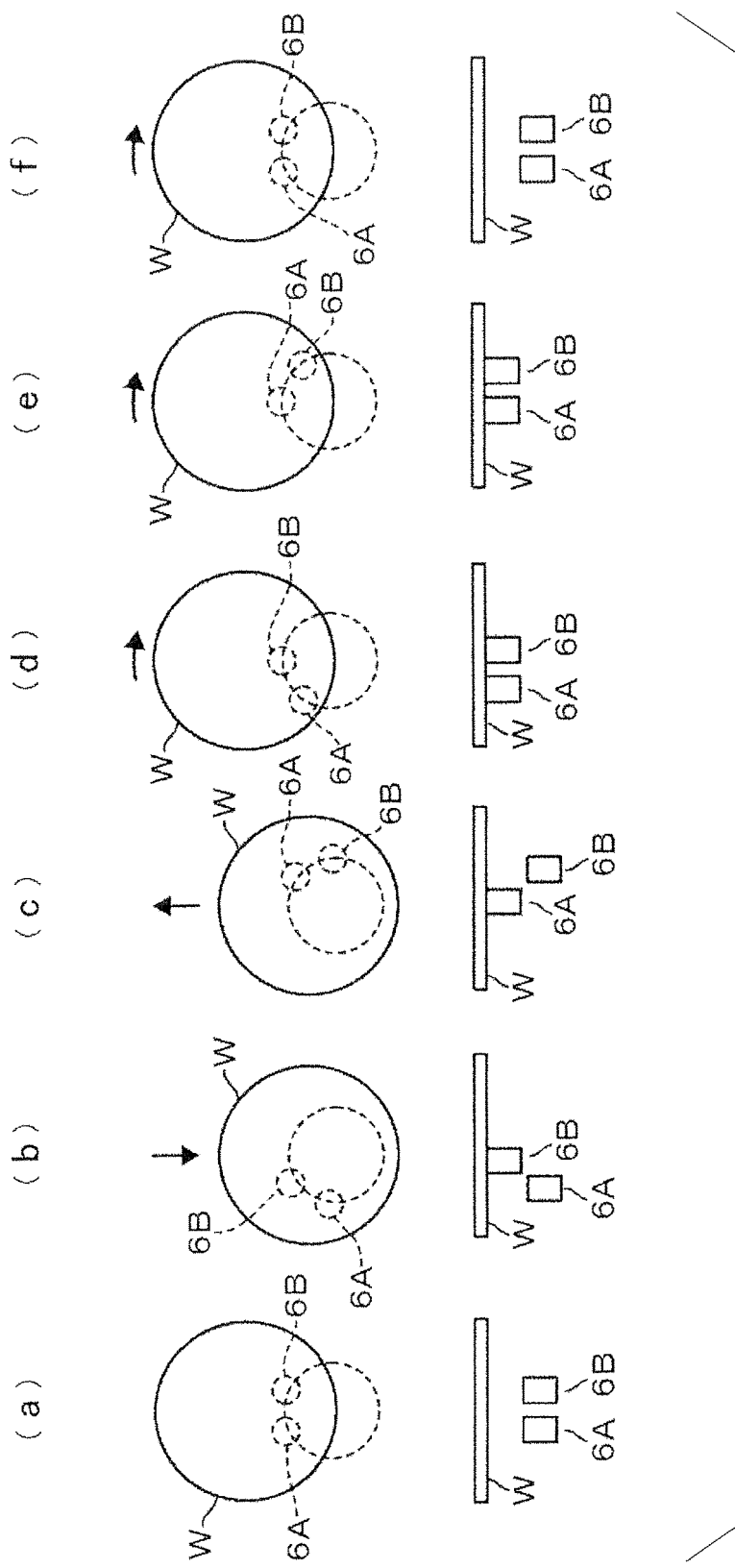
FIG. 7 is a process chart for explaining a cleaning process performed in the cleaning apparatus.
Figure 8:
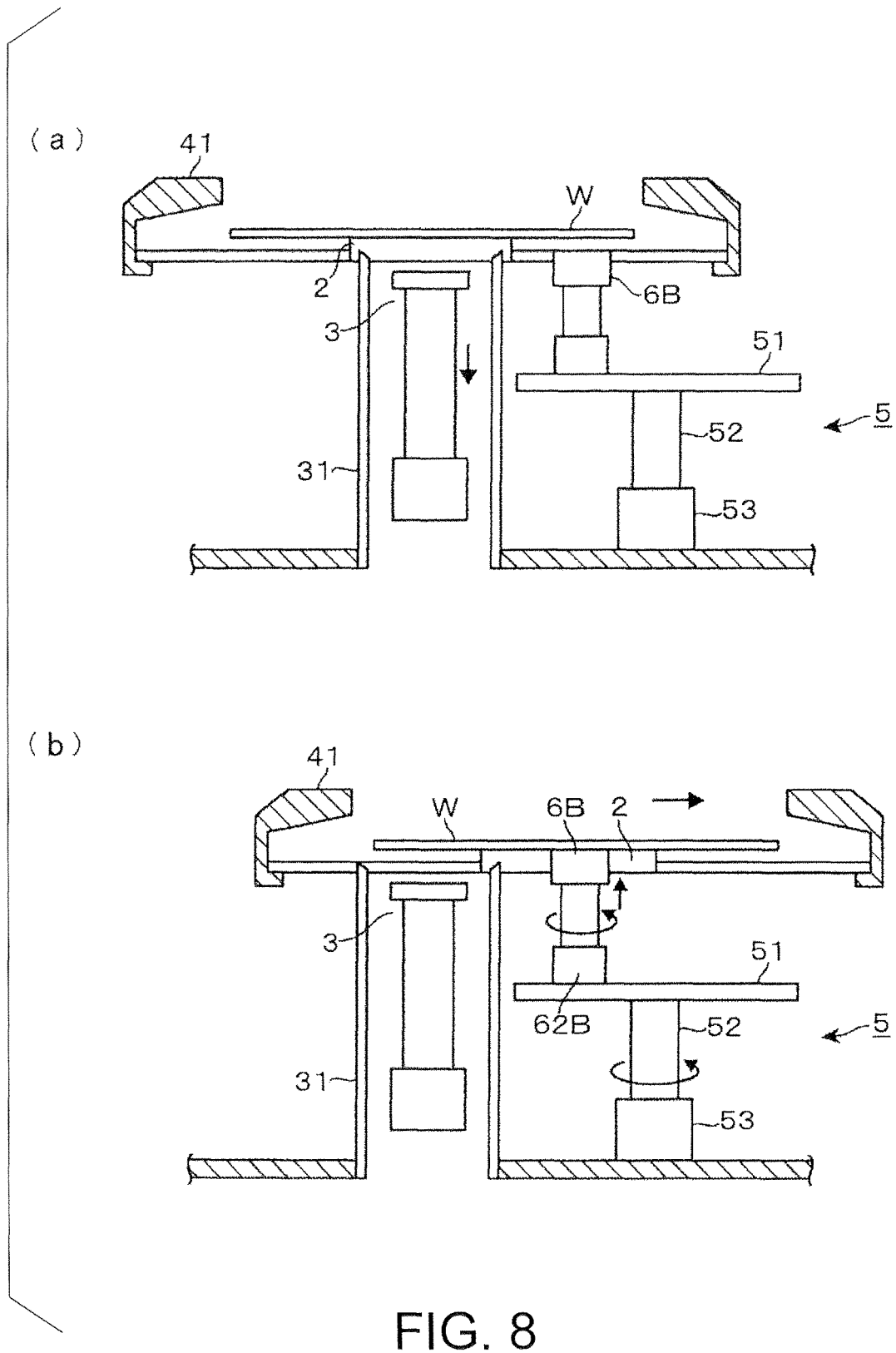
FIG. 8 is a longitudinal sectional view for explaining the cleaning apparatus performed in the cleaning apparatus.
Figure 9:
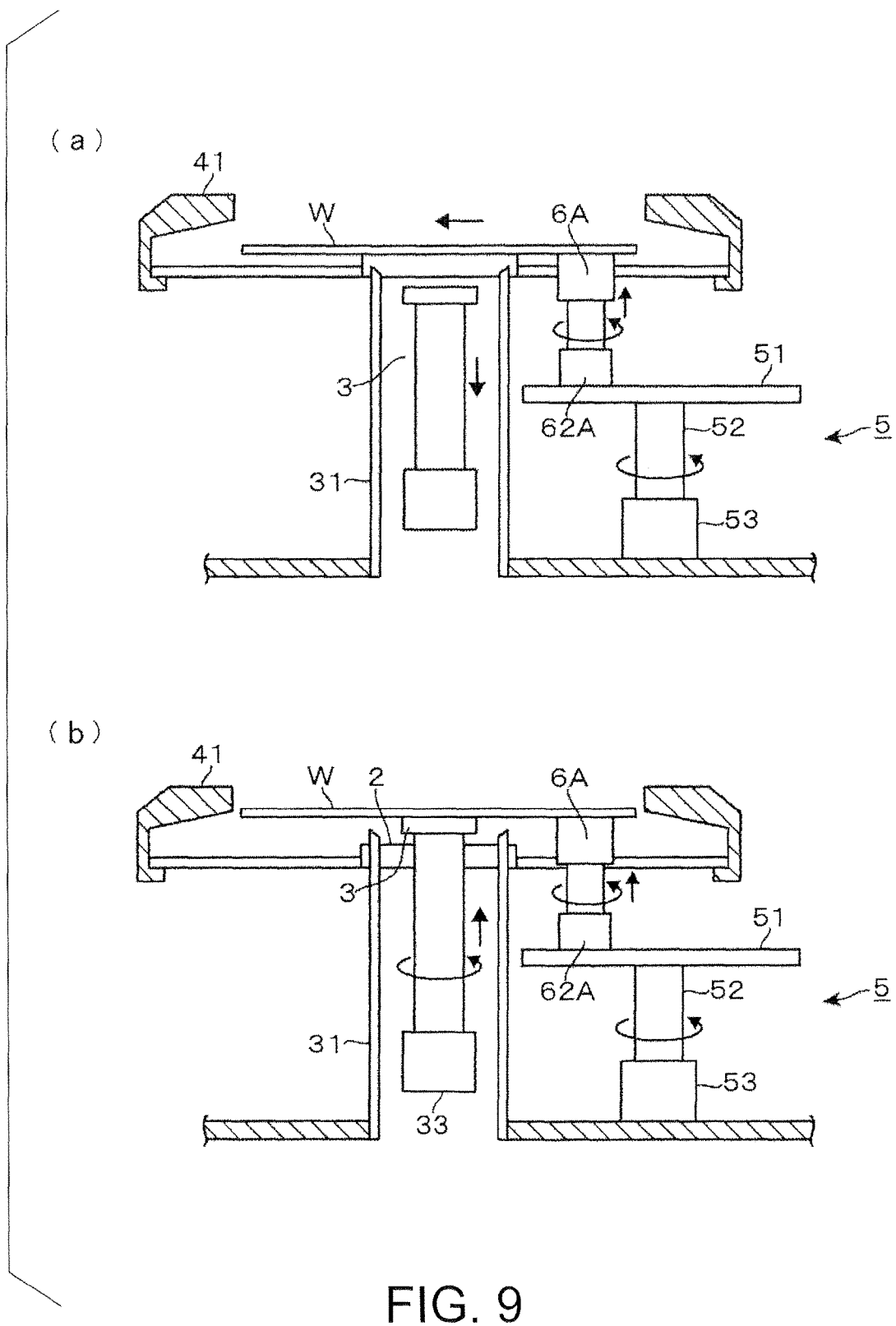
FIG. 9 is a longitudinal sectional view for explaining the cleaning apparatus performed in the cleaning apparatus.
Figure 10:
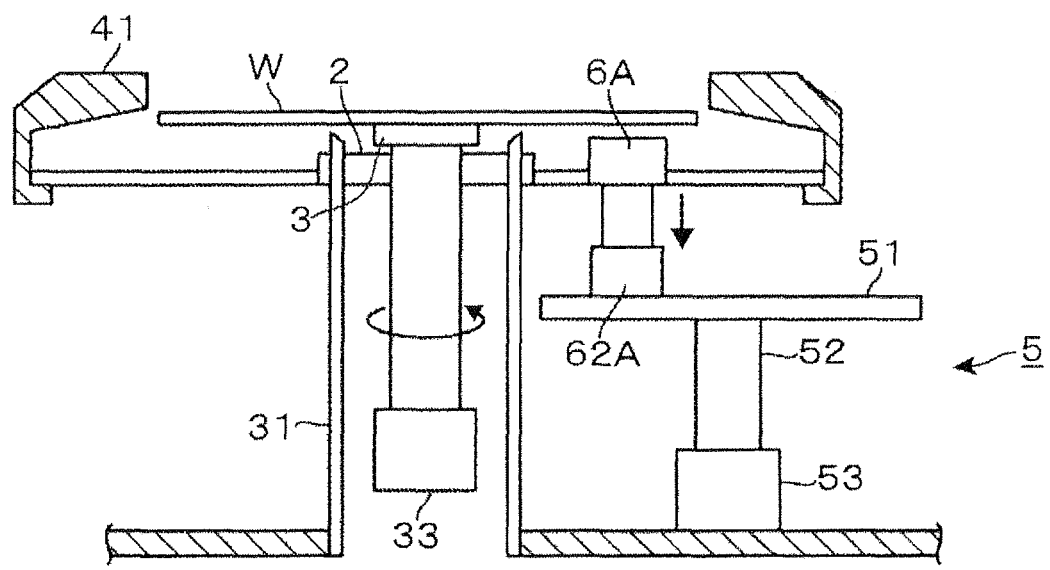
FIG. 10 is a longitudinal sectional view for explaining the cleaning apparatus performed in the cleaning apparatus.
Figure 11:
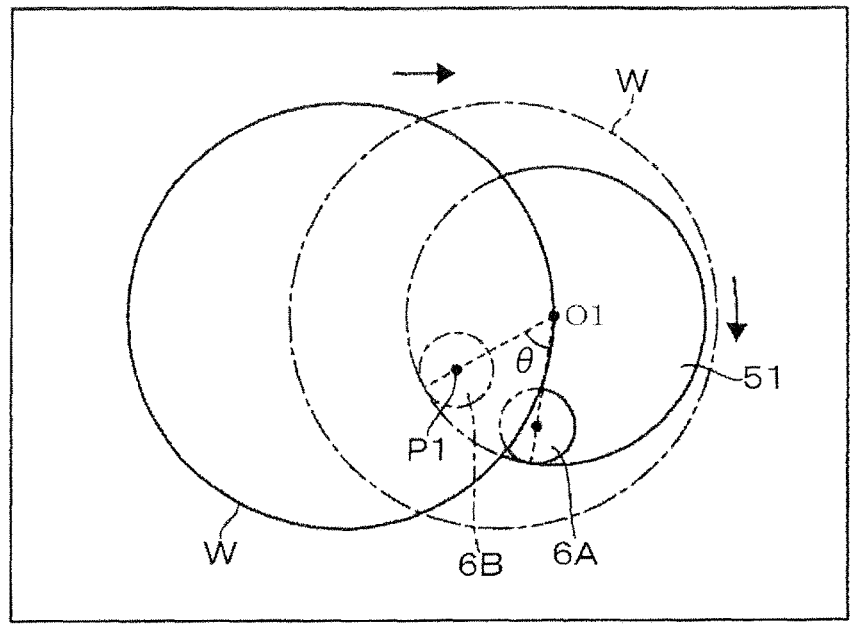
FIG. 11 is a plan view showing a wafer, the first cleaning member, the second cleaning member and the rotating plate.
Figure 11:
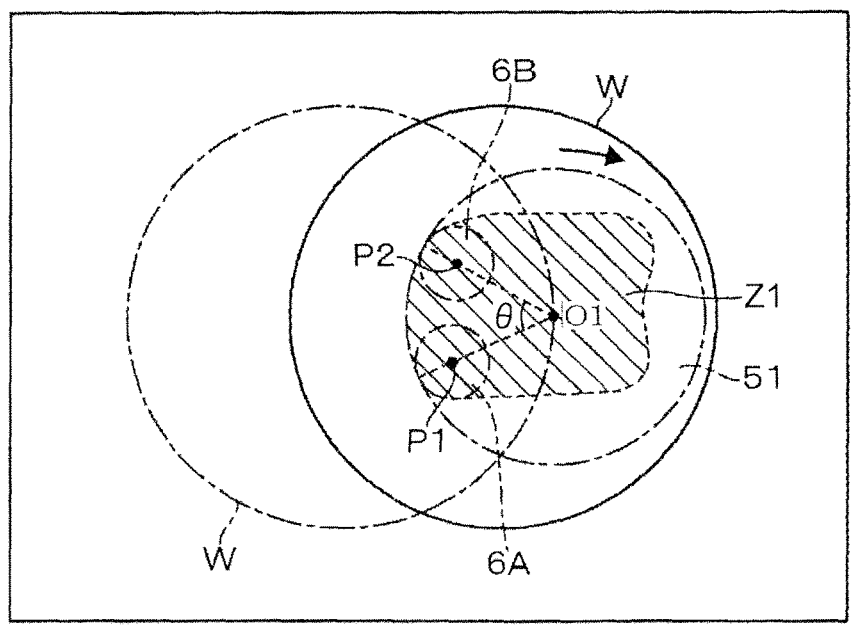
Figure 12:
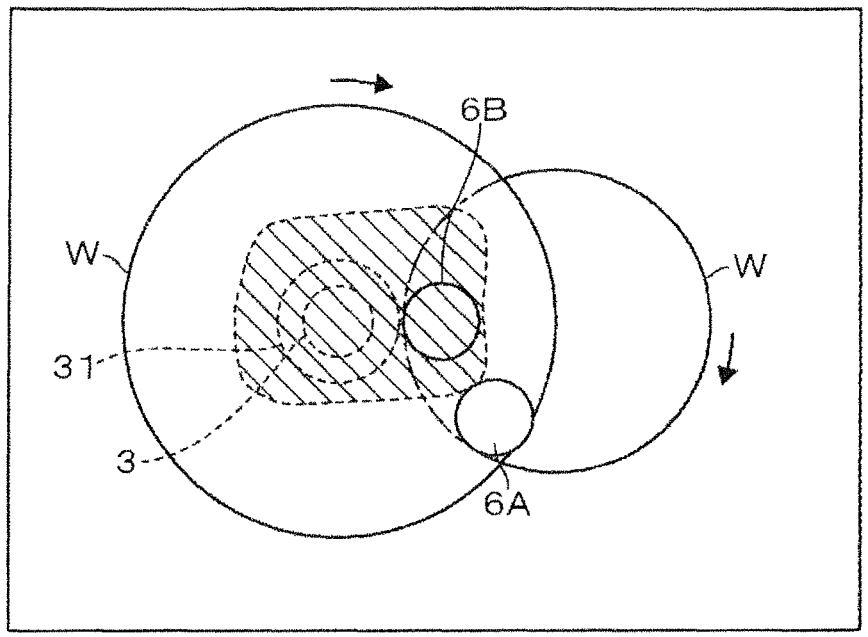
FIG. 12 is a plan view showing a wafer, the first cleaning member, the second cleaning member and the rotating plate.
Figure 12:
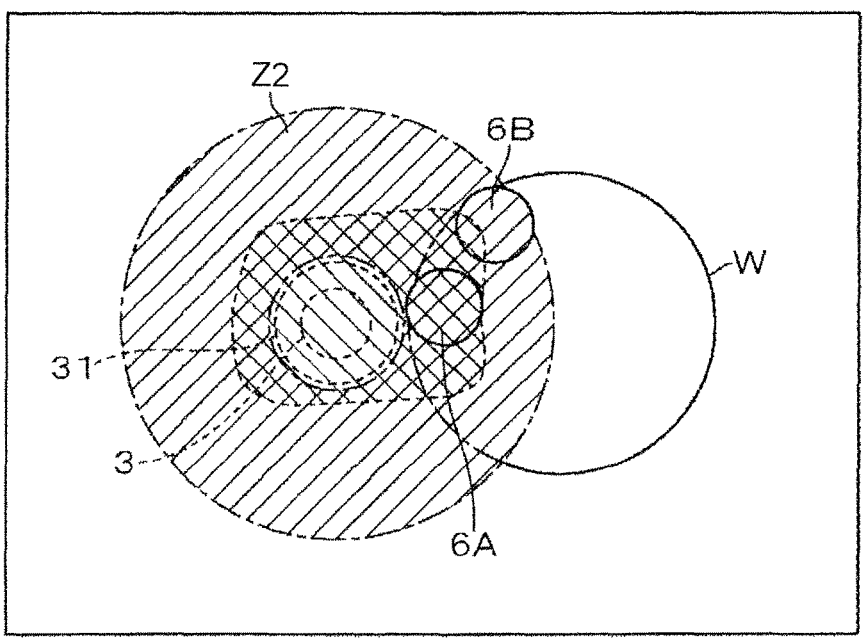

Based on the above-described structure, an operation for cleaning a rear surface of a wafer W is explained with reference to FIGS. 7 to 12. FIG. 7 is a plan view for explaining steps related to the cleaning operation of the rear surface of the wafer W. Dotted lines show the first and second cleaning members 6A and 6B and their turning route. FIGS. 8 to 10 are longitudinal sectional views for explaining the respective operations of the cleaning apparatus 1. FIGS. 11 and 12 are plan views schematically showing a zone of the wafer W to be cleaned, when the wafer W is held by the absorption pads 2 or the spin chuck 3, respectively. In these drawings, illustration of the cover body 54, the brush cover 63A, 63B, the inner cup 42, the exhaust pipe 15, the UV lamp 12, the blow nozzle 13, etc. is suitably omitted according to need.

A transport mechanism (transport arm F3 described herebelow) having, e.g., a horseshoe shape loads a wafer W to be processed into the cleaning apparatus 1, and stops above the opening 41a of the upper cup 41. The support pin 32 moves upward from below the spin chuck 3, and waits below the transport mechanism. The transport mechanism moves downward from above the support pin 32, and transfers the wafer W to the support pin 32. Then, the transport mechanism goes outside the cleaning apparatus 1. At this time, the absorption pads 2 wait at the cleaning position at which the surface of the absorption pad 2 for holding a wafer W is higher than the upper surfaces of the first and second cleaning members 6A and 6B, while the spin chuck 3 retracts to a position that is lower than the upper surfaces of the first and second cleaning members 6A and 6B. Due to this positional relationship, when the support pin 32 moves downward, the wafer W is firstly transferred to the absorption pads 2, and the wafer W is absorbed and held by the absorption pads 2 such that the wafer W is not moved when the cleaning members 6A and 6B urge the wafer W from a rear surface thereof (FIGS. 7(*a*) and 8(*a*)).

Then, as shown in FIGS. 7(*b*) and 8(*b*), there is performed an operation for polishing a zone (central zone) including a central portion in the rear surface of the wafer W. The central zone is a zone including a zone, which is held by the spin chuck 3, of the rear surface of the wafer W. In this operation, the second cleaning member 6B for polishing is moved upward to urge it against the rear surface of the wafer W. Then, the operation for polishing the rear surface of the wafer W is started, by moving rightward the absorption pads 2 absorbing and holding the wafer W in the X direction so that the wafer W is moved from a first position shown in FIG. 8(*a*). Then, the wafer W is transported to a predetermined second position (for example, a position where a right end of the wafer W is located slightly rightward a right end of the rotating plate 51). At this time, the second cleaning member 6B is rotated about the vertical axis by the driving mechanism 53, and the rotating plate 51 is turned simultaneously. Thus, the operation for polishing the rear surface of the wafer W proceeds, by means of the combination of the movement of the wafer W by the absorption pads 2 and the turning movement of the second cleaning member 6B by the rotating plate 51.

FIG. 11(*a*) shows a start position of the turning of the rotating plate 51, and FIG. 11(*b*) shows an end position of the turning of the rotating plate 51. The start position and the end position are determined such that the whole central zone to be polished is covered by the cleaning member 6B. In this manner, a turning angle of the rotating plate 51 from the start position up to the end position is determined. In this example, the turning start position and the turning end position are respectively determined such that a turning angle is an angle $\theta$ that is defined between a line connecting the turning center O1 and the center of the first cleaning member 6A and a line connecting the turning center O1 and the center of the second cleaning member 6B.

As shown in FIGS. 11(*a*) and 11(*b*), by turning the rotating plate 51 clockwise at the degree $\theta$ from the position shown in FIG. 11(*a*) up to the position shown in FIG. 11(*b*), the center of the second cleaning member 6B, for example, is moved from a position P1 to a position P2 so as to polish the rear surface of the wafer W. Owing to this movement, a zone Z1, which is shaded by diagonal lines slanting rightward in FIG. 11(*b*), can be thoroughly polished by the second cleaning member 6B. After the polishing operation has been finished by moving the second cleaning member 6B up to the position P2, the second cleaning member 6B is moved downward to the waiting position. At this time, the center of the first cleaning member 6A is located at the position P1.

Following thereto, as shown in FIGS. 7(*c*) and 9(*a*), there is performed an operation for cleaning the central zone in the rear surface of the wafer W. In this cleaning operation, the first cleaning member 6A for cleaning is moved upward to urge it against the rear surface of the wafer W, and the absorption pads 2 absorbing and holding the wafer W are moved leftward in the X direction from the second position up to the first position. In addition, the air knife 31 is operated to prevent a cleaning liquid from moving to the surface of the spin chuck 3 and adhering thereto. Simultaneously therewith, a cleaning liquid is supplied from the cleaning liquid nozzle 55. Then, the first cleaning member 6A is rotated about the vertical axis, while the rotating plate 51 is turned at the degree $\theta$ clockwise. Thus, the center of the first cleaning member 6A is moved from the position P1 to the position P2.

During the cleaning operation, the whole rear surface of the wafer W is covered with a liquid membrane of the cleaning liquid, so that particles removed by the first cleaning member 6A are washed down to the under cup 43, together with the cleaning liquid flowing down from the rear surface of the wafer W. In addition, a gas is jetted from the jet orifices 31a of the air knife 31 toward the rear surface of the wafer W, so that the cleaning liquid is blown outside the air knife 31. Thus, the rear surface of the wafer W facing the air knife 31 is kept dried. Owing to such a structure, it can be prevented that the cleaning liquid covering the rear surface of the wafer W moves to the inside of the air knife 31. As a result, the surface of the spin chuck 3 is maintained in the dried condition at all times, whereby contamination by the used cleaning liquid and formation of watermark can be prevented. In this manner, the zone Z1 is thoroughly cleaned by the first cleaning member 6A, by means of the combination of the movement of the wafer W by the absorption pads 2 and the turning movement of the first cleaning member 6A by the rotating plate 51. After the cleaning operation has been finished by moving the first cleaning member 6A up to the position P2, the first cleaning member 6A is moved downward to the waiting position.

After the operation for cleaning the zone T1 has been finished, the wafer W is transferred from the absorption pads 2 to the spin chuck 3. The transfer of the wafer W is performed in the following manner. Namely, for example, while the air knife 31 is continued in operation, the movement and the rotation of the cleaning mechanism 5 is stopped and the supply of the cleaning liquid is stopped. Then, the absorption of the wafer W by the absorption pads 2 is released, and the spin chuck 3 at the retracted position is moved upward to the cleaning height position so as to support the rear surface of the wafer W. Finally, the absorption pads 2 are retracted downward.

Succeeding thereto, as shown in FIGS. 7(d), 7(e) and 9(b), there is performed an operation for polishing and cleaning an area (peripheral zone) other than the central portion of the wafer W. To be specific, as shown in FIG. 12(a), the rotating plate 51 is turned and moved to the turning start position at which the first cleaning member 6A for cleaning is located at the periphery and the second cleaning member 6B for polishing is located at the center. Thereafter, the first cleaning member 6A and the second cleaning member 6B are moved upward to urge them against the rear surface of the wafer W. Then, while the wafer W is rotated about the vertical axis by the spin chuck 3, as shown in FIG. 12(b), the rotating plate 51 is turned such that the first cleaning member 6A is located at the center and that the second cleaning member 6B is located at the periphery. At this time, the first and second cleaning members 6A and 6B are respectively rotated, while a cleaning liquid is supplied from the cleaning liquid nozzle 55.

Namely, in the peripheral zone in the rear surface of the wafer W, the polishing operation and the cleaning operation simultaneously proceed, by means of the combination of the rotation of the wafer W by the spin chuck 3 and the turning movement of the first cleaning member 6A and the second cleaning member 6B by the rotating plate 51. While the wafer W is being rotated, the cleaning member 6A is gradually moved from the periphery toward the center and the cleaning member 6B is gradually moved from the center toward the periphery. Thus, the zones of the wafer W with which the cleaning member 6A and the cleaning member 6B are in contact are moved on the rear surface of the wafer W, while the areas depict concentric trajectories. Thus, a zone T2, which is shaded by diagonal lines slanting leftward in FIG. 12(b), can be thoroughly polished and cleaned.

As shown in FIG. 12(b), in order that a combination area of the zone Z1 and the zone Z2 covers the rear surface of the wafer W as a whole without any dead space that is not cleaned, the sizes of the respective equipment and movement ranges thereof are adjusted. During the cleaning operation of the wafer W while it is held by the spin chuck 3, a cleaning liquid is supplied not only from the cleaning liquid nozzle 55 but also from the cleaning liquid nozzle 14 disposed on the left side of the air knife 31. The reason is as follows. When the wafer W having both an area wetted with a cleaning liquid and a dried area is dried, a watermark is likely to be generated. Thus, in order to restrain the generation of watermark, the wafer W is thoroughly supplied with the cleaning liquid. Thus, in this example, a cleaning-liquid supply unit is composed of the cleaning liquid nozzle 55 and the cleaning nozzle 14. However, the cleaning-liquid supply unit may be composed of any one of the cleaning liquid nozzle 55 and the cleaning liquid nozzle 14.

After the cleaning operation of the whole rear surface of the wafer W has been completed, as shown in FIGS. 7(f) and 10, the rotation of the first cleaning member 6A and the second cleaning member 6B is stopped, and the first and second cleaning members 6A and 6B are moved downward. Then, the supply of the cleaning liquid is stopped, and an operation for spinning of the cleaning liquid is performed. The spin-off drying operation is performed by rotating the spin chuck 3 at a high speed, so as to spin off the cleaning liquid adhering to the rear surface of the wafer W. As described above, the generation of watermark can be restrained by drying the wafer W, which is thoroughly wetted with the cleaning liquid, by spinning off the cleaning liquid at once. In this drying operation, the blow nozzle 13 retracted above is moved downward, and simultaneously therewith, the rotating plate 51 is moved such that the blow nozzle 56 is located at the peripheral portion of the wafer W. Under this condition, a gas is blown from below and above the peripheral portion of the wafer W, whereby the spin-off drying effect can be promoted. The second zone, which is held by the spin chuck 3, cannot be dried by the spin-off drying operation. However, since this zone is dried by the air knife 31 and is in contact with the spin chuck 3 under the dried condition, there is little possibility that a watermark is generated.

After the whole rear surface of the wafer W has been cleaned and dried by the aforementioned operations, the wafer W is transferred to the transport mechanism by an operation reverse to the loading operation so as to be unloaded. At this time, the UV lamp 12 is turned on so as to irradiate ultraviolet light from below the horseshoe-shaped transport mechanism toward the rear surface of the wafer W. Thus, even if a particle adheres thereto, an organic matter, for example, is decomposed by the irradiation of ultraviolet light. Thus, the particle of this type can be contracted to thereby reduce an influence such as defocusing.

Meanwhile, simultaneously with the unloading operation of the wafer W, the absorption pads 2 and the spin chuck 3 are moved up to the positions shown in FIG. 8(a) so as to wait loading of a succeeding wafer W. Then, the process explained with reference to FIGS. 8 to 12 is repeated, whereby a plurality of wafers W are sequentially cleaned.

According to the above embodiment, since the rear surface of the wafer W is supported and held, and the wafer W is cleaned under this condition, it is not necessary to provide, in addition to the cleaning apparatus 1, a space in which a reverser for reversing a wafer W is installed and a space in which a wafer W is reversed. For this reason, as compared with a cleaning apparatus of a conventional type, the coating/developing apparatus in which the cleaning apparatus 1 is installed can be made smaller. Further, since a wafer W is transferred between the two substrate holding mechanisms (absorption pad 2, spin chuck 3), there is no dead space which is covered with the absorption pad 2 and/or the spin chuck 3 and thus cannot be cleaned.

In addition, since the rear surface of the wafer W is cleaned by the first cleaning member 6A and the second cleaning member 6B, a contact area of the wafer W and the cleaning members is larger, which can improve detergency as compared with a case in which only one cleaning member is used. Further, the first cleaning member 6A and the second cleaning member 6B are configured to be horizontally turned by the common turning shaft 52. When the central zone of a substrate is cleaned, the turning shaft 52 is located to be overlapped with the wafer W. Since the turning shaft 52 is installed within the moving area of the wafer W, the size of the apparatus can be reduced.

Further, in the present invention, the rear surface of the wafer W is cleaned in such a manner that the central zone and the peripheral zone are cleaned separately from each other. Thus, as compared with a case in which the whole rear surface of the wafer W is cleaned at once, the respective cleaning zones are smaller. Thus, even when the turning radii of the first and second cleaning members 6A and 6B are shorter than the radius of the wafer W, the whole rear surface of the wafer W can be cleaned. Namely, the radius of the rotating plate 51 is smaller than the radius of the wafer W, and the turning shaft 52 of the rotating plate 51 is located below the moving area of the wafer W. Thus, when the wafer W is slid during the cleaning operation of the central zone in the rear surface of the wafer W, the wafer W and the rotating plate 51 are overlapped with each other in plan view. Thus, even when the rotating plate 51 is located on the lateral side of the spin chuck 3, it is not necessary to prepare an installation space in addition to the moving area, whereby the size of the cleaning apparatus 1 can be more reduced.

On the other hand, when the rear surface of the wafer W is cleaned in such a manner that the central zone and the peripheral zone are not separated from each other, the cleaning member has to be moved up to the outer periphery of the wafer W through the center of the wafer W. Thus, when the driving mechanism of the cleaning member is located outside the wafer W, the turning radius of the cleaning member is larger than the radius of the wafer W, which enlarges the size of the apparatus.

In addition, as described above, since the rear surface of the wafer W is cleaned in such a manner that the central zone and the peripheral zone are separated from each other so that the respective cleaning zones are smaller, the moving distance of the cleaning members 6A and 6B is shorter. This moving distance directly reflects a cleaning time. Thus, as compared with a case in which the brush is moved from the center of the wafer W to the outer periphery thereof, the cleaning time can be shortened, which enhances a throughput.

Further, the cleaning members 6A and 6B are arranged such that, when the peripheral zone other than the central portion in the rear surface of the wafer W is cleaned, the first cleaning member 6A is turned and moved in one direction from the turning shaft 52 of the rotating plate 51 so that the first and second cleaning members 6A and 6B clean the peripheral zone in the rear surface of the wafer W. Thus, since the whole peripheral zone in the rear surface of the wafer W is cleaned by turning and moving the cleaning members 6A and 6B in the one direction, the moving time of the cleaning members 6A and 6B is short, which improves a throughput.

Furthermore, when the first cleaning member 6A starts to turn in the one direction, the second cleaning member 6B is located on the line L connecting the turning shaft 52 of the rotating plate 51 and the rotation and elevation shaft 3b of the spin chuck 3. Upon the end of the turning movement, the first cleaning member 6A is located on the line L. Namely, in the cleaning operation using the two cleaning members 6A and 6B at the same time, by moving the one cleaning member 6A (6B) from the center to the periphery, the whole peripheral zone in the rear surface of the wafer W can be thoroughly cleaned. Thus, the wafer W can be cleaned without largely turning the cleaning members 6A and 6B, whereby the present invention is effective in improvement of a throughput.

Also in the cleaning operation using one of the two cleaning members 6A and 6B, when the one cleaning member 6A is moved clockwise from the center to the periphery, for example, the other cleaning member 6B is located on the center. Thus, by moving then the other cleaning member 6B counterclockwise or clockwise from the center to the periphery, the whole peripheral zone of the wafer W can be thoroughly cleaned.

Namely, due to the inventive positioning of the first cleaning member 6A and the second cleaning member 6B, there is no useless movement in the turning movement of the rotating plate 51. Thus, a process time can be reduced whereby a throughput can be improved.

Further, the first cleaning member 6A is for cleaning and the second cleaning member 6B is for polishing, i.e., the first and second cleaning members 6A and 6B are of different types. Thus, two kinds of processes of polishing process and the cleaning process can be performed in one apparatus. Thus, as compared with a case in which a polishing apparatus and a cleaning apparatus are respectively incorporated in the coating/developing apparatus, the coating/developing apparatus can be made smaller as a whole. Moreover, the first and second cleaning members 6A and 6B are attached to the rotating plate 51 that is a planar body, and the driving mechanism 53 is disposed on the rear surface side of the rotating plate 51. Thus, although a cleaning liquid is supplied to the rear surface of the wafer W from below so that the cleaning liquid is likely to scatter around, adhesion of the cleaning liquid to the driving mechanism 53 can be prevented because of the rotating plate 53 between the wafer W and the driving mechanism 53. In addition, since the circumference of the driving mechanism 53 and the circumference of the brush driving mechanism are respectively covered with the cover body 54 and the brush cover 63A, 63B, the driving mechanisms 53 and 62A, 62B can be prevented from water.

Figure 13:
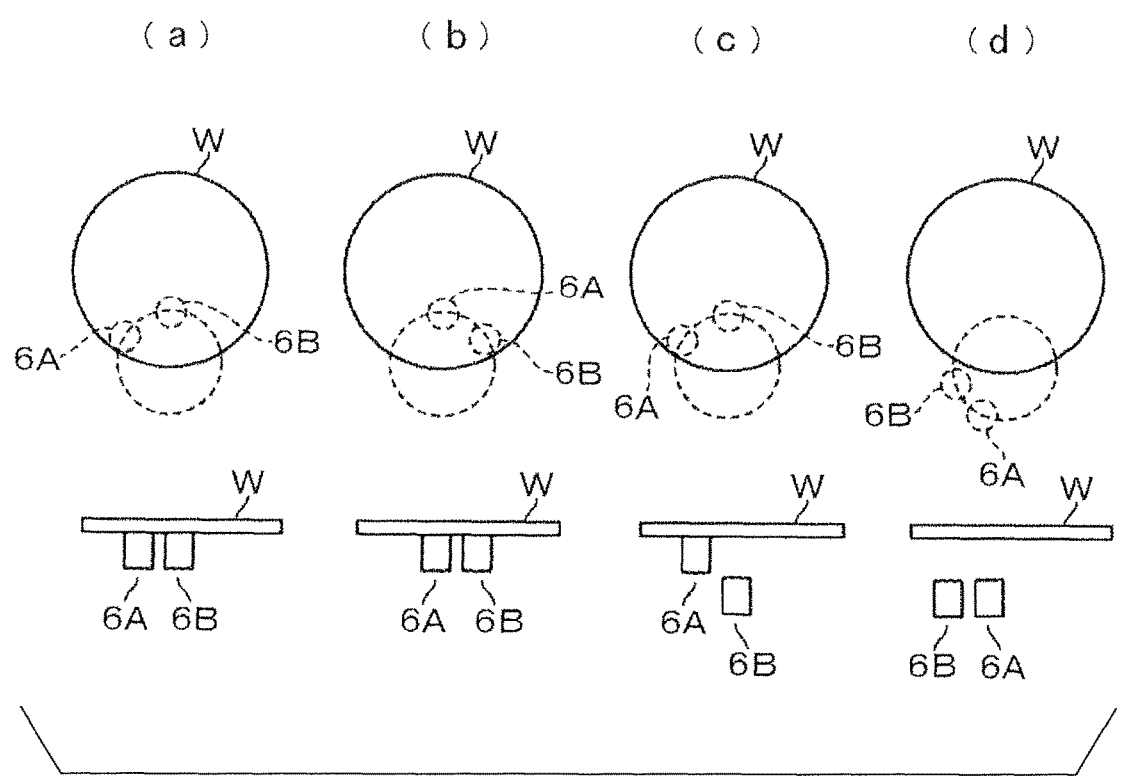
FIG. 13 is a process chart for explaining another example of the cleaning process performed in the cleaning apparatus.

The above example is one of the examples of the cleaning method, and the movement of the cleaning member during the cleaning operation is not limited to the above example. For example, as shown in FIG. 13, after the steps shown in FIG. 7 have been sequentially performed, the polishing operation and the cleaning operation of the peripheral zone of the wafer W may be repeated (steps shown in FIGS. 13(a) and 13(b)), similarly to the steps shown in FIGS. 7(d) and 7(e), and thereafter, a re-cleaning operation of the wafer W (step shown in FIG. 13(c), may be performed. The steps shown in FIGS. 13(a) and 13(b) are as described above. In the re-cleaning step of the wafer W shown in FIG. 13(c), only the first cleaning member 6A for cleaning is moved upward to the cleaning position, with the second cleaning member 6B for polishing being maintained at the waiting position. Then, the wafer W is rotated by the spin chuck 3, and the first cleaning member 6A, which is being rotated, is turned and moved from the center to the periphery, so that the peripheral zone in the rear surface of the wafer W is cleaned. As shown in the step shown in FIG. 13(d), for example, the first and second cleaning members 6A and 6B are then retracted outside the wafer W, the rotation of the first cleaning member 6A is stopped, the supply of a cleaning liquid is stopped, and the spin-off drying operation is performed by rotating the spin chuck 3 at a high speed.

Alternatively, the respective steps may be performed in the following order. Namely, there are performed loading of the wafer W (step shown in FIG. 7(a)), polishing of the central zone of the wafer W (step shown in FIG. 7(b)), cleaning of the central zone of the wafer W (step shown in FIG. 7(c)), polishing and cleaning of the peripheral zone of the wafer W (steps shown in FIGS. 13(a) and 13(b)), re-cleaning of the wafer W (step shown in FIG. 13(c)), and drying of the wafer W (step shown in FIG. 13(d)). The respective steps are as described above.

In the step shown in FIG. 13(a), it is not necessarily needed that the first cleaning member 6A for cleaning is in contact with the wafer W. In this case, in the step shown in FIG. 13(a), polishing of the wafer W by the second cleaning member 6B is performed.

In the above structure, as long as the first and second cleaning members 6A and 6B are laterally spaced apart from each other, so as to clean the zone including the central portion in the rear surface of the wafer W that is held by the absorption pads 2 and to clean the zone other than the central portion in the rear surface of the wafer W that is held by the spin chuck 3, the detergency can be improved. Thus, the positioning of the the first and second cleaning members 6A and 6B is not limited to the aforementioned example. In addition, as long as the turning shaft 52 of the first and second cleaning members 6A and 6B is located within the moving area of the wafer W, the size of the apparatus can be reduced. Thus, it is not necessarily needed to make shorter the turning radii of the first and second cleaning members 6A and 6B than the radius of the wafer W. Further, the first and second cleaning members 6A and 6B may be of the same type or of the different types. The same type means that a material and a pore size are the same. Depending on a type of the cleaning process, when the central zone in the rear surface of the wafer W is cleaned, the first and second cleaning members 6A and 6B may be simultaneously brought into contact with the rear surface of the wafer W so as to clean the same. In addition, when the peripheral zone of the wafer W is cleaned, one of the first and second cleaning members 6A and 6B may be brought into contact with the rear surface of the wafer W so as to clean the same.

In addition, the cleaning member may be a member that cleans the rear surface of the wafer W without being in contact with the rear surface of the wafer W. For example, there may be employed a cleaning member, such as a two-fluid nozzle, a jet nozzle or a megasonic nozzle, which is configured to jet a cleaning liquid or the like to remove particles. Moreover, in this embodiment, the rotary type cleaning members 6A and 6B are shown by way of example, an oscillatory cleaning member (brush) may be employed instead thereof. Further, a type of the cleaning liquid is not limited to DIW, and another cleaning liquid may be employed. It is sufficient for the turning mechanism to have a planar body that is disposed on the turning shaft to extend in the circumferential direction thereof, and thus the planar body is not limited to a circular plate.

Further, the substrate holding mechanisms installed on the cleaning apparatus is not limited to the two types (absorption pad 2, spin chuck 3) as shown in the embodiment. For example, the cleaning apparatus may have three or more types of substrate holding mechanisms, and a substrate may be transferred among these substrate holding mechanisms twice or more. In addition, the present invention is not limited to the two types of cleaning members 6A and 6B, and three or more types of cleaning members may be provided. At this time, a cleaning member of a type that cleans the rear surface of the wafer W with being in contact with the same, and a cleaning member of a type that cleans the rear surface of the wafer W without being in contact with the same, may be combined to each other.

Further, the cleaning operation of a substrate of the present invention includes processes such as an operation for polishing a rear surface of the substrate with the use of the cleaning member, and a cleaning operation to be performed after substrates adhered to each other by an adhesive have been separated from each other, for removing the adhesive adhering to the substrates. For example, there is briefly explained the substrate cleaning process which is to be performed after substrates have been separated from each other. In accordance with a larger diameter of a wafer W as a substrate, a wafer to be processed is reinforced by adhering it to a support substrate by an adhesive, in order to prevent warping and/or cracking of the wafer W when a rear surface of the wafer W is polished. At this time, the wafer W is adhered to the support substrate such that a surface to be processed of the wafer W faces downward whereby the rear surface of the wafer faces upward. Thus, the surface to be processed of the wafer is adhered to the support substrate. Thereafter, the wafer W is polished with the rear surface thereof facing upward, and then the wafer to be processed and the support substrate are separated from each other. After that, the surface to be processed of the wafer to be processed is cleaned. Since the wafer to be processed is separated with the surface to be processed facing downward, the surface to be processed is cleaned by the cleaning apparatus 1 of the present invention, with the surface to be processed remaining facing downward. Thus, in this cleaning process, the surface to be processed of the wafer to be processed corresponds to the rear surface of the substrate. For example, there is employed a cleaning member of a type that cleans the wafer with being in contact with the same, or a cleaning member such as a two-fluid nozzle of a type that cleans the wafer without being in contact with the same.

Figure 14:
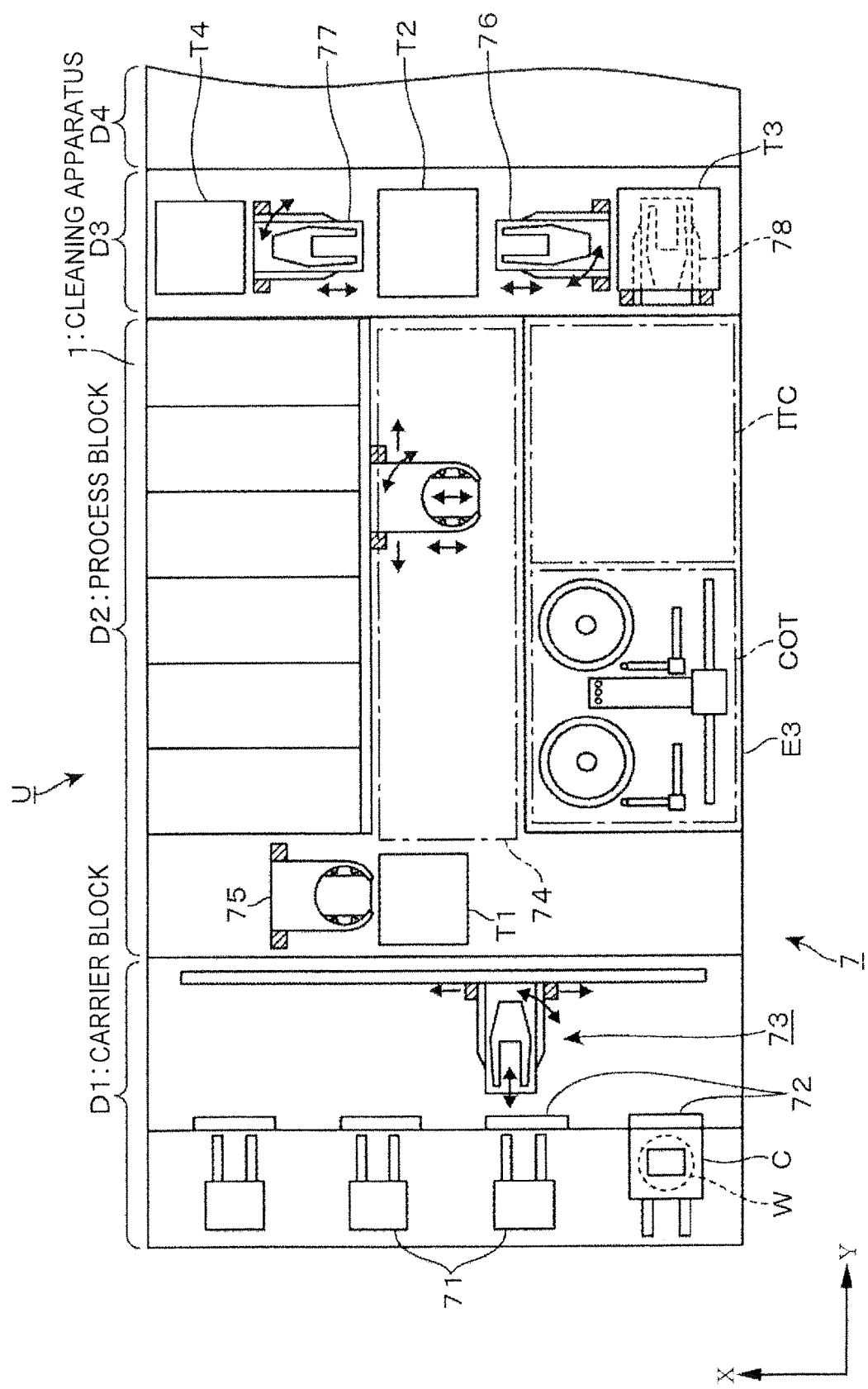
FIG. 14 is a plan view of a coating/developing apparatus in which the cleaning apparatus is incorporated.
Figure 15:
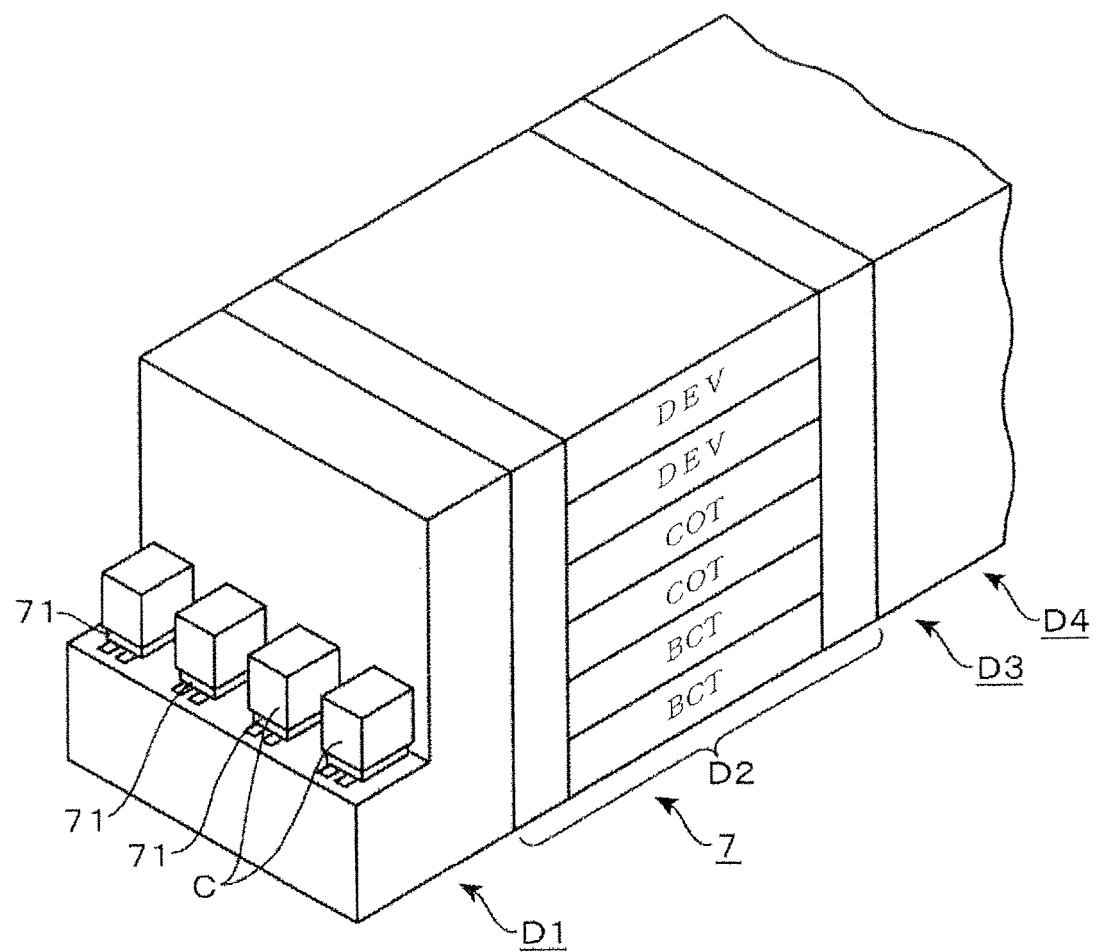
FIG. 15 is a perspective view showing the coating/developing apparatus.
Figure 16:
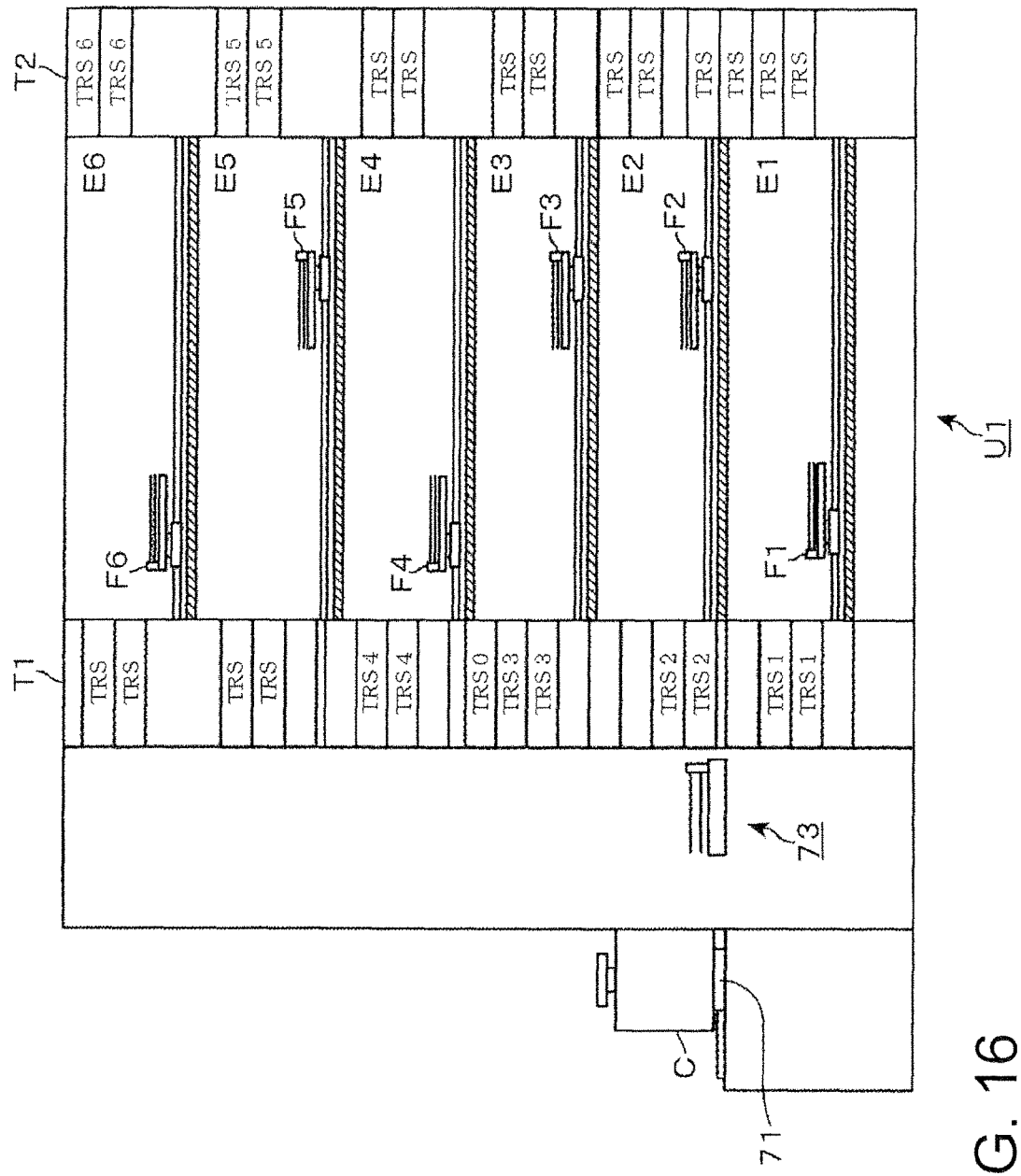
FIG. 16 is a longitudinal sectional view showing the coating/developing apparatus.

FIGS. 14 to 16 show an example of the coating/developing apparatus in which the aforementioned cleaning apparatus 1 is incorporated. FIG. 14 is a plan view of the coating/developing apparatus 7, FIG. 15 is a perspective view thereof, and FIG. 16 is a schematic longitudinal sectional view thereof. The coating/developing apparatus 7 is constituted by connecting linearly a carrier block D1, a process block D2, and an interface block D3. An exposure apparatus D4 is further connected to the interface block D3. In the below description, an arrangement direction of the blocks D1 to D3 is referred to as "back and front direction". The carrier block D1 has a function for loading a carrier C containing a plurality of wafers W, which are substrates of the same lot, into the coating/developing apparatus 7 and for unloading the carrier C therefrom. The carrier block D1 is equipped with a table 71 on which the carrier C is placed, an opening and closing unit 72, and a delivering mechanism 73 for transporting a wafer W from the carrier C through the opening and closing unit 72.

The process block D2 is constituted by stacking first to sixth unit blocks B1 to B6 for liquid-processing a wafer W, in this order from below. As a matter of explanation convenience, a process for forming a lower-layer side antireflection film on a wafer W is referred to as "BCT", a process for forming a resist film on a wafer W is referred to as "COT", and a process for forming a resist pattern on an exposed wafer W is referred to as "DEV", respectively. In this example, as shown in FIG. 15, two BCT layers, two COT layers and two DEV layers are stacked one on another, in this order from below. In the same blocks, wafers W are transported and processed at the same time.

Herein, the COT layer E3 among the unit blocks is explained as a representative with reference to FIG. 14. A plurality of shelf units U are arranged in the back and front direction on one of the right and left sides of a transport area 74 which extends from the farrier block D1 toward the interface block D3. On the other side, a resist-film forming module COT and a protection-film forming module ITC, which are liquid-processing modules, are arranged in the back and front direction. The resist-film forming module COT is configured to form a resist film by supplying a resist to a wafer W. The protection-film forming module ITC is configured to form a protection film for protecting a resist film by supplying a predetermined process liquid onto the resist film. The shelf unit U includes a heating module and the cleaning apparatus 1. The cleaning apparatus 1 is installed on, e.g., the side of the interface block D. The transport area 74 is provided with a transport arm F3 that is a transport mechanism of a wafer W.

The other unit blocks E1, E2, E5 and E6 are constituted similarly to the unit blocks E3 and E4, excluding that a different chemical liquid is supplied to a wafer W. The unit blocks E1 and E2 include antireflection-film forming modules instead of the resist-film forming module COT, and the unit blocks E5 and E6 include developing modules. In FIG. 16, transport arms of the respective unit blocks E1 to E6 are indicated by the reference characters F1 to F6.

In the process block D2, there are provided a tower T1 and a transfer arm 75, on the side of the carrier block D1. The tower T1 vertically extends along the respective unit blocks E1 to E6. The transfer arm 75 is elevatable for transferring a wafer W to and from the tower T1. The tower T1 is composed of a plurality of modules stacked one on another. The modules located at the respective heights of the unit blocks E1 to E6 can transfer a wafer W to and from the respective transport arms F1 to F6 of the unit blocks E1 to E6. These modules include a transfer module TRS, a temperature regulating module CPL configured to regulate a temperature of a wafer W, a buffer module configured to temporarily accommodate a plurality of wafers W, a hydrophobing module configured to make hydrophobic a surface of a wafer W and so on.

The interface block D3 includes towers T2, T3 and T4 vertically extending along the unit blocks E1 to E6. A wafer W is transferred to and from the towers T2 and T3 by an elevatable interface arm 76. A wafer W is transferred to and from the towers T2 and T4 by an elevatable interface arm 77. In addition, there is provided an interface arm 78 configured to transfer a wafer W between the tower T2 and the exposure apparatus D4.

In the tower T2, a transfer module TRS, a buffer module configured to accommodate a plurality of wafer W that are not yet exposed, a buffer module configured to accommodate a plurality of wafers that have been already exposed, a temperature regulating module configured to regulate a temperature of a wafer W and so on are stacked one on another. The towers T3 and T4 also respectively include modules, but description thereof is omitted herein.

A transport route of a wafer W in the system composed of the coating/developing apparatus 7 and the exposure apparatus D4. Wafers W in each lot are unloaded from the carrier C. Namely, after all the wafers in one lot have been unloaded, wafers W in another lot are configured to be unloaded from the carrier C. Before wafers W are unloaded, a transport route of each wafer W is preset, and a wafer W is transported to a preset process block among the double process blocks as described above.

The wafers W are transported from the carrier C by the delivering mechanism 73 to the transfer module TRS0 of the tower T1 in the process block D2. The wafers W are transported from the transfer module TRS0 separately into the unit blocks E1 and E2.

For example, when the wafer W is transferred to the unit block E1, the wafer W is transferred from the transfer module TRS0 to the transfer module TRS1 (transfer module capable of transferring the wafer W by the transport arm F1), which corresponds to the unit block E1, among the transfer modules TRS of the tower T1. On the other hand, when the wafer W is transferred to the unit block E2, the wafer W is transferred from the transfer module TRS0 to the transfer module TRS2 corresponding to the unit blocks E2, among the transfer modules TRS of the tower T1. The transfer of the wafers W is performed by the transfer arm 75.

The wafer W transferred separately is transported from the transfer module TRS1 (TRS2), the antireflection-film forming module, a heating module, and the transfer module TRS1 (TRS2), in this order. Following thereto, the wafers W are transferred, by the transfer arm 75, separately to the transfer module TRS3 corresponding to the unit block E3 and the transfer module TRS4 corresponding to the unit block E4.

The wafer W in the transfer module TRS3 (TRS4) is transferred from the transfer module TRS3 (TRS4), the resist-film forming module COT, the heating module, the protection-film forming module ITC, the heating module, the cleaning apparatus 1, and the transfer module TRS of the tower 2, in this order. The wafer W having been transferred to the transfer module TRS is loaded into the exposure apparatus D4 through the tower T3 by the interface arms 76 and 78. The exposed wafer W is transported between the towers T2 and T4 by the interface arm 77, and is transported to the transfer module TRS5 (TRS6) of the tower 2 corresponding to the unit block E5 (E6). Then, the wafer W is transported to the heating module, the developing module, the heating module, and the transfer module TRS of the tower T1. Thereafter, the wafer W is returned to the carrier C through the delivering mechanism 73.

Although the cleaning apparatus 1 is installed on the shelf unit U of the unit blocks E3 and E4, the location at which the cleaning apparatus 1 is installed in the coating/developing apparatus 7 may be the tower 2 of the interface block D3. In this case, a wafer W, on which a resist film and a protection film have been formed, is transported to the interface block D3. The wafer W is subjected to the cleaning process in the interface block D3, and then the wafer W is transported to the exposure apparatus D4.

W Wafer
1 Cleaning apparatus
2 Absorption pad
3 Spin chuck
3b Rotation and elevation shaft
5 Cleaning mechanism
51 Rotating plate
52 Turning shaft
53 Driving mechanism
6A First cleaning member
6B Second cleaning member
62A, 62B Elevation mechanism

What is claimed is:

1. A substrate cleaning apparatus configured to clean a rear surface of a circular substrate, comprising:
   a control unit for controlling operations of the substrate cleaning apparatus;
   a first absorbing and holding unit configured to be horizontally movable while horizontally absorbing and holding a zone that does not overlap with a central portion in the rear surface of the substrate;
   a second absorbing and holding unit configured to be rotated about a vertical axis while horizontally absorbing and holding the central portion in the rear surface of the substrate;

a first cleaning member and a second cleaning member that are laterally spaced apart from each other on a turning mechanism, the first cleaning member and the second cleaning member being configured to be in contact with the zone including the central portion in the rear surface of the substrate so as to clean the same, when the substrate is held by the first absorbing and holding unit, and being configured to be in contact with a zone other than the central portion in the rear surface of the substrate so as to clean the same, when the substrate is held by the second absorbing and holding unit;

the turning mechanism configured to horizontally turn the first cleaning member and the second cleaning member along turning radii, respectively, by a common turning shaft, when the rear surface of the substrate is cleaned;

an elevation mechanism configured to move upward or downward the first cleaning member and the second cleaning member; and a cleaning-liquid supply unit configured to supply a cleaning liquid onto the rear surface of the substrate, when the rear surface of the substrate is cleaned by the first cleaning member and the second cleaning member;

wherein the turning shaft is located to be overlapped with the substrate, at least when the zone including the central portion in the rear surface of the substrate is cleaned, and wherein, the first cleaning member and the second cleaning member are arranged on the turning mechanism, with each respective cleaning member having a driving mechanism that is connected to the turning mechanism, such that each of the cleaning members can be individually rotated about a vertical axis, and when the substrate held by the second absorbing and holding unit is rotated, in a plan view, one of the first cleaning member and the second cleaning member is at a first cleaning position located at a center other than the central portion in the rear surface of the substrate and the other of the first cleaning member and the second cleaning member is located at a periphery in the rear surface of the substrate on one side of a right side and a left side relative to a rotating axis of the second absorbing and holding unit, the first cleaning member and the second cleaning member are turned and moved by the turning mechanism toward the other side along the turning radii until the one of the first cleaning member and the second cleaning member is at a second cleaning position located at the periphery in the rear surface of the substrate on the other side of the right side and the left side relative to the rotating axis of the second absorbing and holding unit and the other of the first cleaning member and the second cleaning member is located at the center other than the central portion in the rear surface of the substrate, so that the first and second cleaning positions and the respective movement therebetween of the first cleaning member and the second cleaning member clean the whole zone other than the central portion in the rear surface of the substrate.

2. The substrate cleaning apparatus according to claim 1, wherein
the turning radii of the first cleaning member and the second cleaning member are shorter than a radius of the substrate.

3. The substrate cleaning apparatus according to claim 1, wherein
when the first cleaning member and the second cleaning member start to turn from the one side toward the other side, the one of the first cleaning member and the second cleaning member is located on a line connecting the turning shaft and the rotating axis of the second absorbing and holding unit, and when the turning is finished, the other of the first cleaning member and the second cleaning member is located on the line.

4. The substrate cleaning apparatus according to claim 1, wherein
the first cleaning member and the second cleaning member are of types different from each other.

5. The substrate cleaning apparatus according to claim 1, wherein
the turning mechanism includes a planar body disposed on the turning shaft to extend along a circumferential direction thereof, and
the first cleaning member and the second cleaning member are disposed on the planar body.

6. The substrate cleaning apparatus according to claim 1, wherein the first and second cleaning members each have a center, and the turning radii of the first cleaning member and the second cleaning member is a radius having a length of a line connecting the centers of the first and second cleaning members, respectively, to a turning center of the turning mechanism, such that the turning radii of the first cleaning member and the second cleaning member have the same radius.

7. A substrate cleaning method for cleaning a rear surface of a circular substrate, comprising:
using a turning mechanism configured to horizontally turn a first cleaning member and a second cleaning member along turning radii, respectively, by a common turning shaft;

horizontally absorbing and holding a zone that does not overlap with a central portion in the rear surface of the substrate by a first absorbing and holding unit, and turning the first cleaning member and the second cleaning member in contact with the zone including the central portion in the rear surface of the substrate so as to clean the zone, while supplying a cleaning liquid to the rear surface of the substrate; and horizontally absorbing and holding the central portion in the rear surface of the substrate by a second absorbing and holding unit, and, with the second absorbing and holding unit being rotated around a vertical axis, turning the first cleaning member and the second cleaning member in contact with a zone other than the central portion in the rear surface of the substrate so as to clean the zone, while supplying a cleaning liquid to the rear surface of the substrate;

wherein the turning shaft is located to be overlapped with the substrate, at least when the zone including the central portion in the rear surface of the substrate is cleaned, and wherein the first cleaning member and the second cleaning member are arranged on the turning mechanism, with each respective cleaning member having a driving mechanism that is connected to the turning mechanism, such that each of the cleaning members can be individually rotated about a vertical axis, and when the substrate held by the second absorbing and holding unit is rotated, in a plan view, one of the first cleaning member and the second cleaning member is at a first cleaning position located at a center other than the central portion in the rear surface of the substrate and the other of the first cleaning member and the second cleaning member is located at a periphery in the rear surface of the substrate on one side of a right side and a left side relative to a rotating axis of the second absorbing and holding unit, the first cleaning member and the second cleaning member are turned and moved by the turning mechanism toward the other side along the turning radii until the one of the first cleaning member and the second cleaning member is at a second cleaning position located at the periphery in the rear surface of the substrate on the other side of the right side and the left side relative to the rotating axis of the second absorbing and holding unit and the other of the first cleaning member and the second cleaning member is located at the center other than the central portion in the rear surface of the substrate, so that the first and second cleaning positions and the respective movement therebetween of the first cleaning member and the second cleaning member clean the whole zone other than the central portion in the rear surface of the substrate.

8. The substrate cleaning method according to claim 7, wherein
the turning radii of the first cleaning member and the second cleaning member are shorter than a radius of the substrate.

9. The substrate cleaning method according to claim 7, wherein
when the first cleaning member and the second cleaning member start to turn from the one side toward the other side, the one of the first cleaning member and the second cleaning member is located on a line connecting the turning shaft and the rotating axis of the second absorbing and holding unit, and
when the turning is finished, the other of the first cleaning member and the second cleaning member is located on the line.

10. The substrate cleaning method according to claim 7, wherein
the first cleaning member and the second cleaning member are of types different from each other.

11. The substrate cleaning method according to claim 7, wherein the first and second cleaning members each have a center, and the turning radii of the first cleaning member and the second cleaning member is a radius having a length of a line connecting the centers of the first and second cleaning members, respectively, to a turning center of the turning mechanism, such that the turning radii of the first cleaning member and the second cleaning member have the same radius.

12. A non-transitory storage medium storing a program for use in a substrate cleaning apparatus for cleaning a rear surface of a circular substrate,
wherein the program has steps for performing the substrate cleaning method according to claim 7.

* * * * *